(12) United States Patent
Nakamura et al.

(10) Patent No.: US 7,381,480 B2
(45) Date of Patent: Jun. 3, 2008

(54) MAGNETIC RECORDING ELEMENT AND MAGNETIC RECORDING DEVICE USING THE SAME

(75) Inventors: Shiho Nakamura, Fujisawa (JP); Shigeru Haneda, Yokohama (JP); Hirofumi Morise, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 11/117,482

(22) Filed: Apr. 29, 2005

(65) Prior Publication Data

US 2006/0060901 A1     Mar. 23, 2006

(30) Foreign Application Priority Data

Sep. 17, 2004   (JP)   .......................... 2004-272298
Apr. 1, 2005    (JP)   .......................... 2005-106439

(51) Int. Cl.
G11B 5/33       (2006.01)
H01L 29/82      (2006.01)
G11C 11/15      (2006.01)

(52) U.S. Cl. .................. 428/811.5; 428/815; 428/816; 360/324.12; 365/158; 365/173; 257/421

(58) Field of Classification Search ............... 428/828, 428/811.5
See application file for complete search history.

(56) References Cited

U.S. PATENT DOCUMENTS

| | | | | |
|---|---|---|---|---|
| 5,161,233 A | * | 11/1992 | Matsuo et al. | ............... 399/136 |
| 5,493,465 A | * | 2/1996 | Kamiguchi et al. | ...... 360/324.1 |
| 5,695,864 A | | 12/1997 | Slonczewski | |
| 6,023,395 A | * | 2/2000 | Dill et al. | ................ 360/324.2 |
| 6,532,164 B2 | * | 3/2003 | Redon et al. | .................. 365/97 |
| 6,780,524 B2 | * | 8/2004 | Lin et al. | ..................... 428/814 |
| 6,956,766 B2 | * | 10/2005 | Nakamura et al. | .......... 365/171 |
| 6,958,927 B1 | * | 10/2005 | Nguyen et al. | ............. 365/158 |
| 6,985,385 B2 | * | 1/2006 | Nguyen et al. | ............. 365/173 |
| 6,990,013 B2 | * | 1/2006 | Sato et al. | .................. 365/158 |

(Continued)

OTHER PUBLICATIONS

F.J. Albert, et al., "Spin-polarized current switching of a Co thin film nanomagnet", Applied Physics Letters, vol. 77, No. 23, Dec. 4, 2000, pp. 3809-3811.

(Continued)

Primary Examiner—Carol Chaney
Assistant Examiner—Gary Harris
(74) Attorney, Agent, or Firm—Oblon, Spivak, McClelland, Maier & Neustadt, P.C.

(57) ABSTRACT

A magnetic recording element includes a fixed layer having first and second surfacesm, a recording layer having third and fourth surfaces and being essentially made of a ferromagnetic material having first and second atomic potentials for the majority-spin band electrons and the minority-spin band electrons, a spacer layer being arranged between the fixed and recording layers and being in contact with the second and third surfaces, a cap layer having fifth and sixth surfaces, being essentially made of a nonmagnetic material having a third atomic potential less than an intermediate value between the first and second atomic potentials, and having a thickness of not more than 3 nm, the fifth surface being in contact with the fourth surface, and a reflecting layer being in contact with the sixth surface and being essentially made of a nonmagnetic material having a forth atomic potential different from the third atomic potential.

20 Claims, 19 Drawing Sheets

U.S. PATENT DOCUMENTS

| | | | |
|---|---|---|---|
| 7,120,049 B2 * | 10/2006 | Nakamura et al. | 365/171 |
| 7,161,829 B2 * | 1/2007 | Huai et al. | 365/158 |
| 2002/0105827 A1 * | 8/2002 | Redon et al. | 365/173 |
| 2004/0136231 A1 * | 7/2004 | Huai et al. | 365/158 |
| 2004/0165425 A1 * | 8/2004 | Nakamura et al. | 365/171 |
| 2004/0170055 A1 * | 9/2004 | Albert et al. | 365/173 |
| 2004/0257863 A1 * | 12/2004 | Sato et al. | 365/158 |
| 2005/0045913 A1 * | 3/2005 | Nguyen et al. | 257/200 |
| 2005/0063222 A1 * | 3/2005 | Huai et al. | 365/171 |
| 2006/0187705 A1 * | 8/2006 | Nakamura et al. | 365/171 |

OTHER PUBLICATIONS

S.I. Kiselev, et al., "Current-Induced Nanomagnet Dynamics for Magnetic Fields Perpendicular to the Sample Plane", Physical Review Letters, vol. 93, No. 3, Jul. 16, 2004, pp. 036601-1 through 036601-4.

* cited by examiner

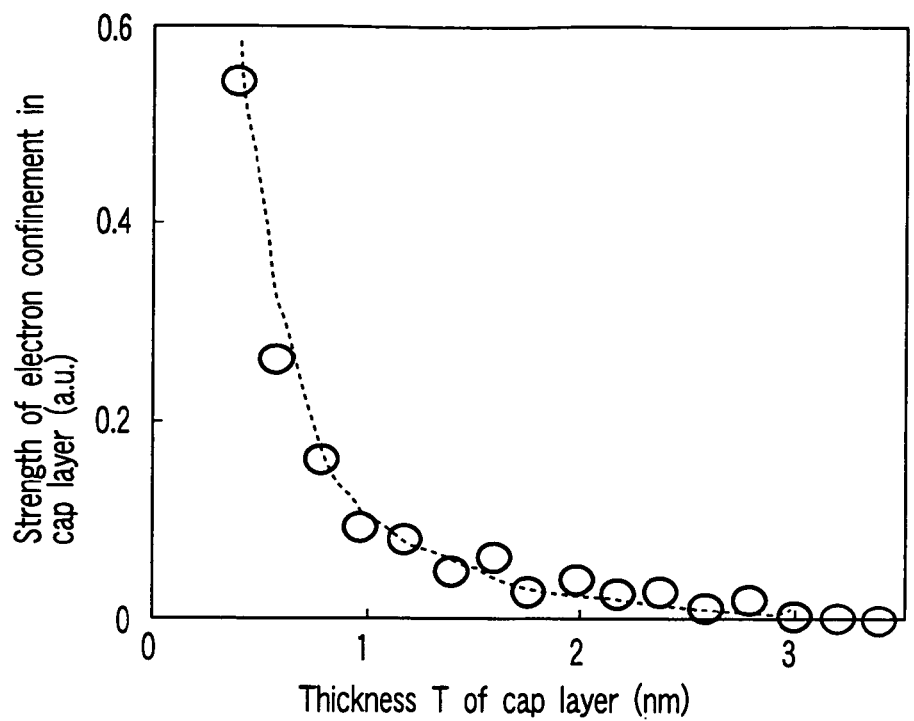
F I G. 5A
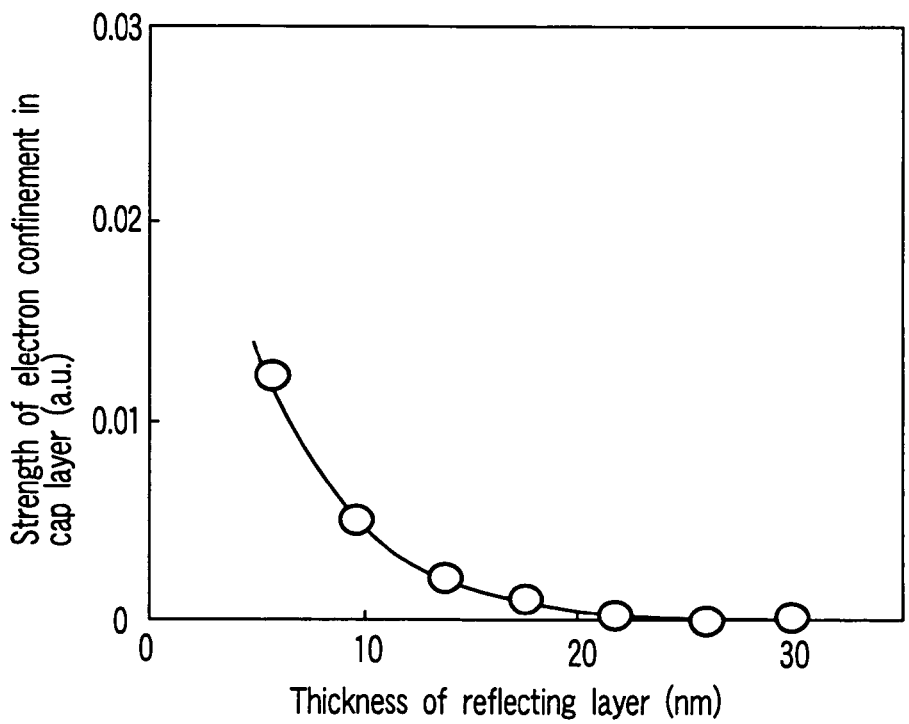
F I G. 5B

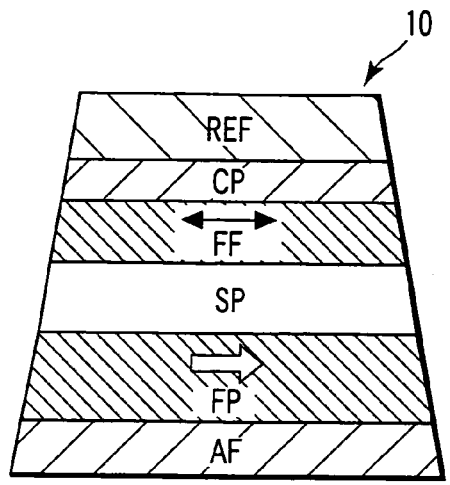
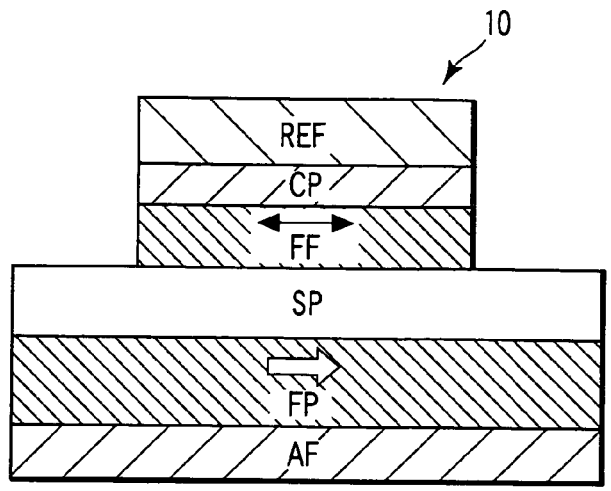
FIG. 10A                FIG. 10B
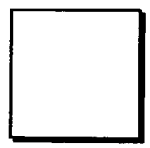
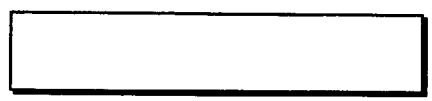
FIG. 11A                FIG. 11B
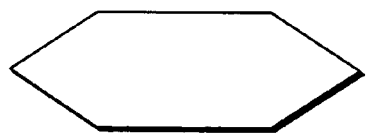
FIG. 11C                FIG. 11D
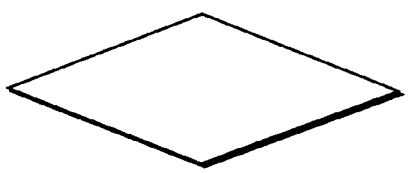
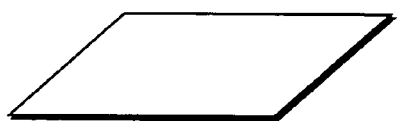
FIG. 11E                FIG. 11F
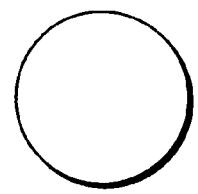
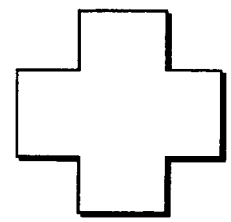
FIG. 11G                FIG. 11H

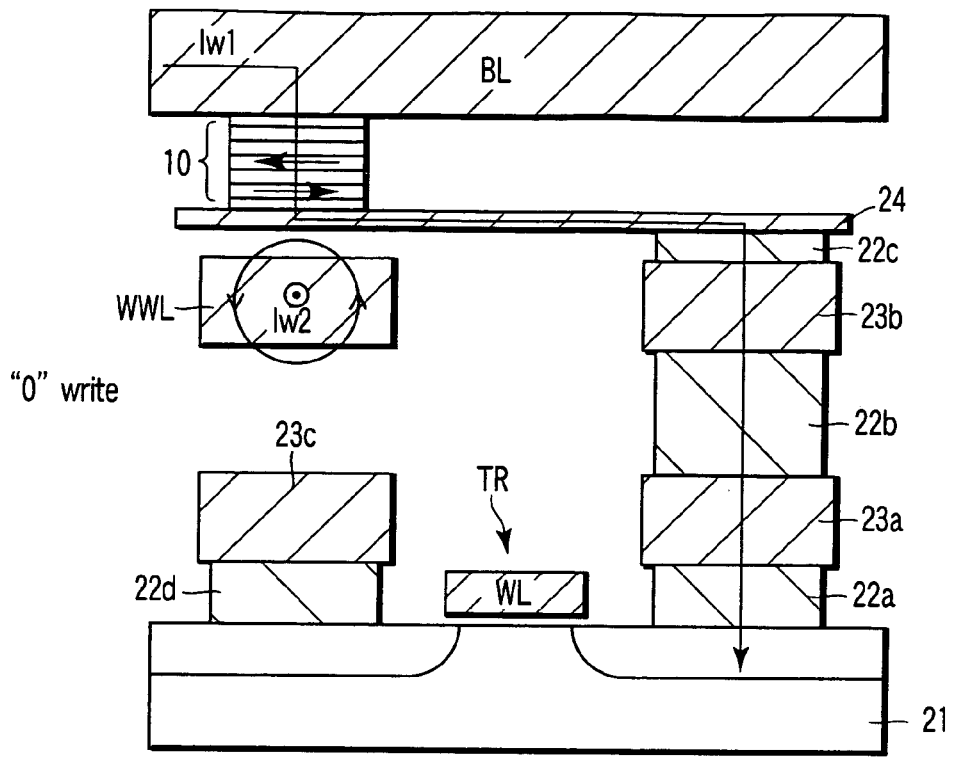
FIG. 19A "0" write
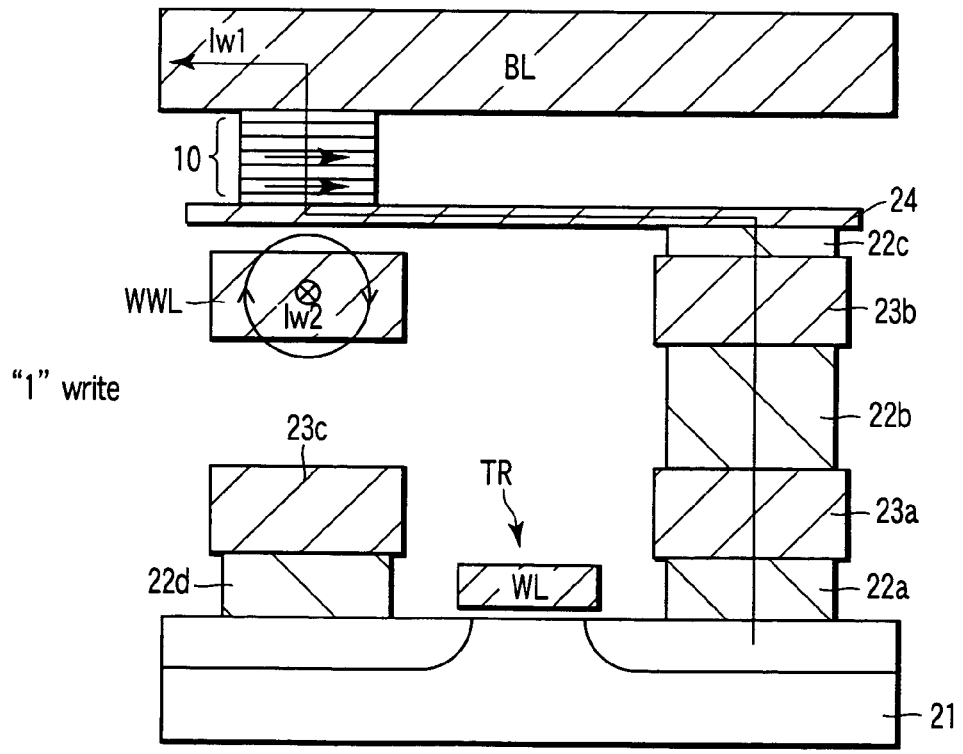
FIG. 19B "1" write

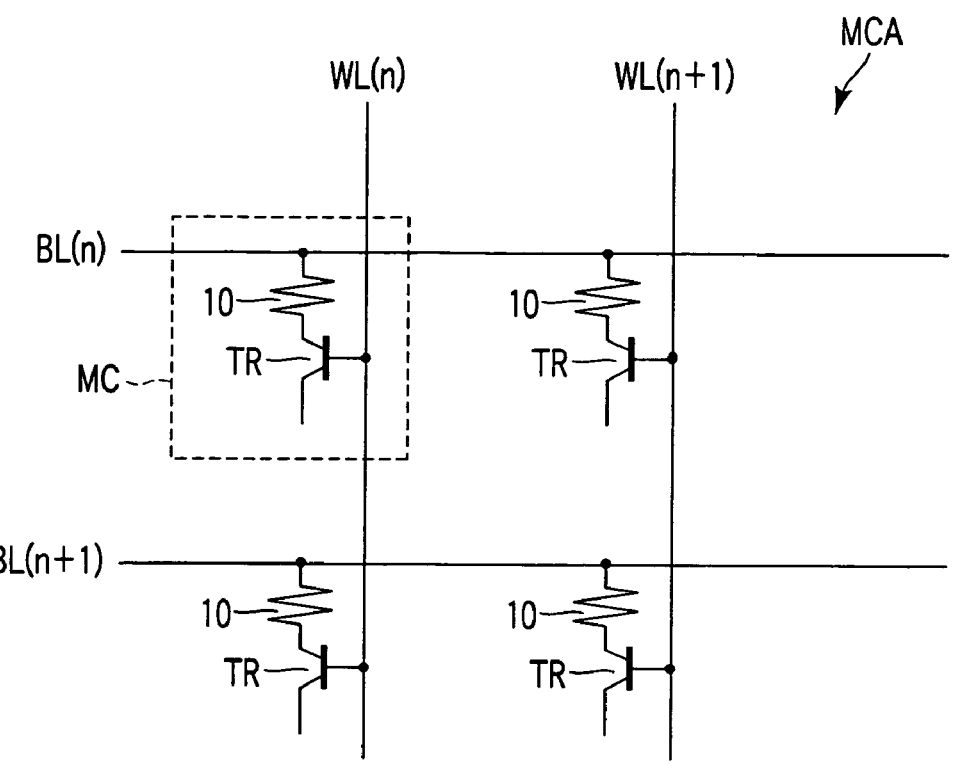
F I G. 21
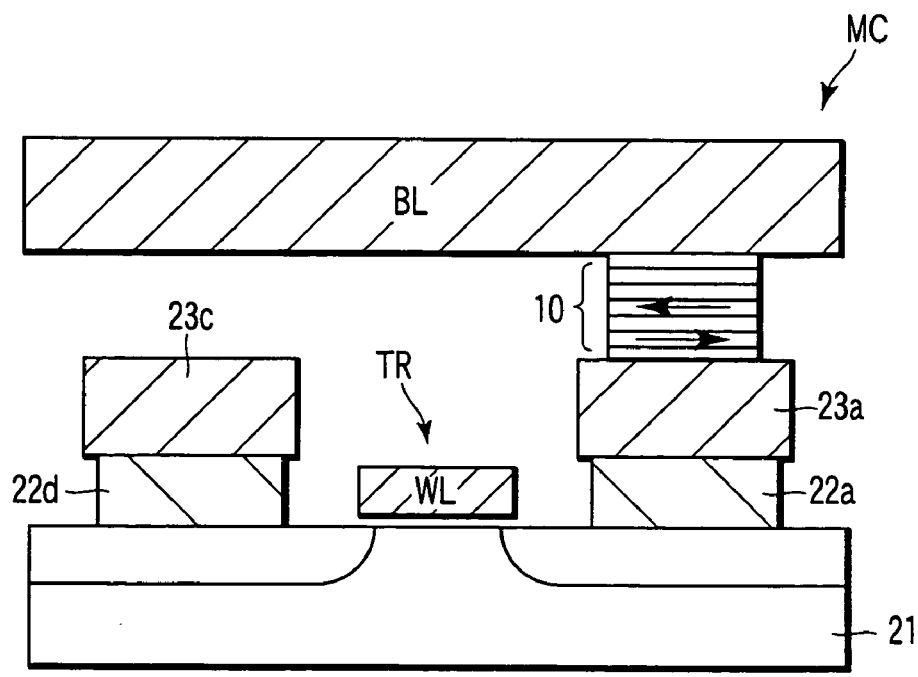
F I G. 22

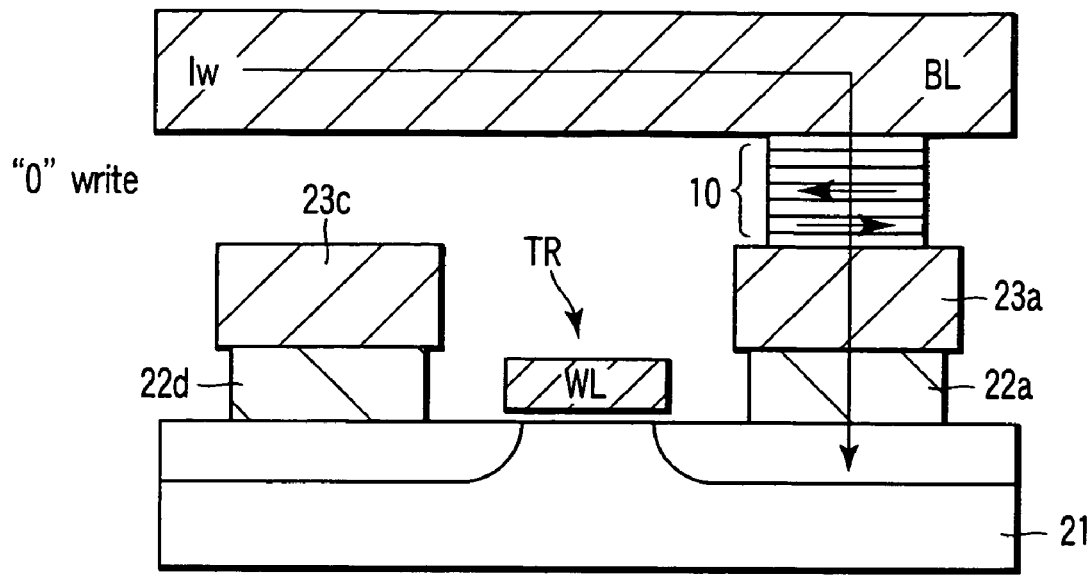
F I G. 23A
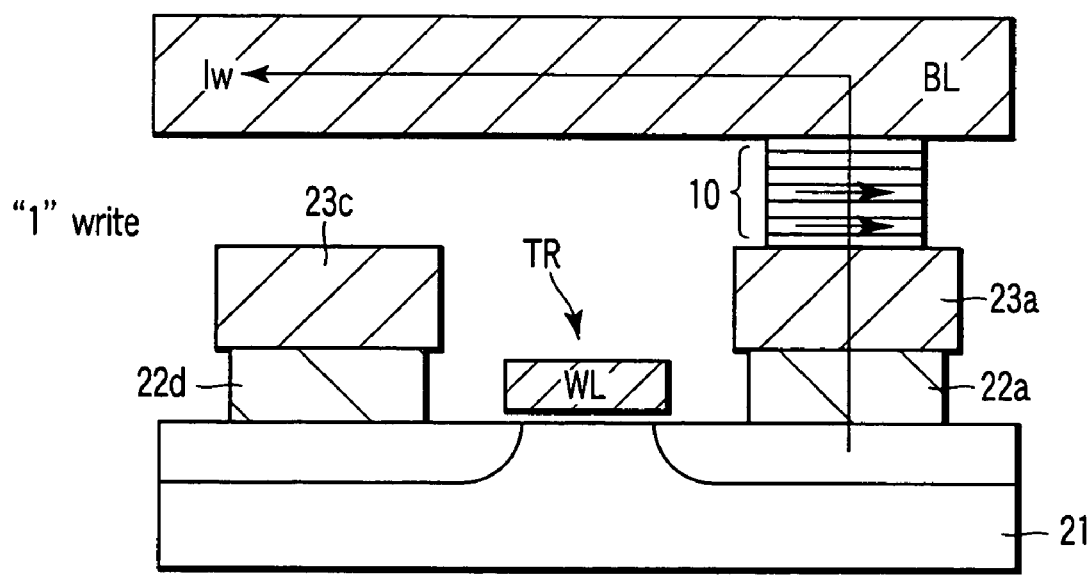
F I G. 23B

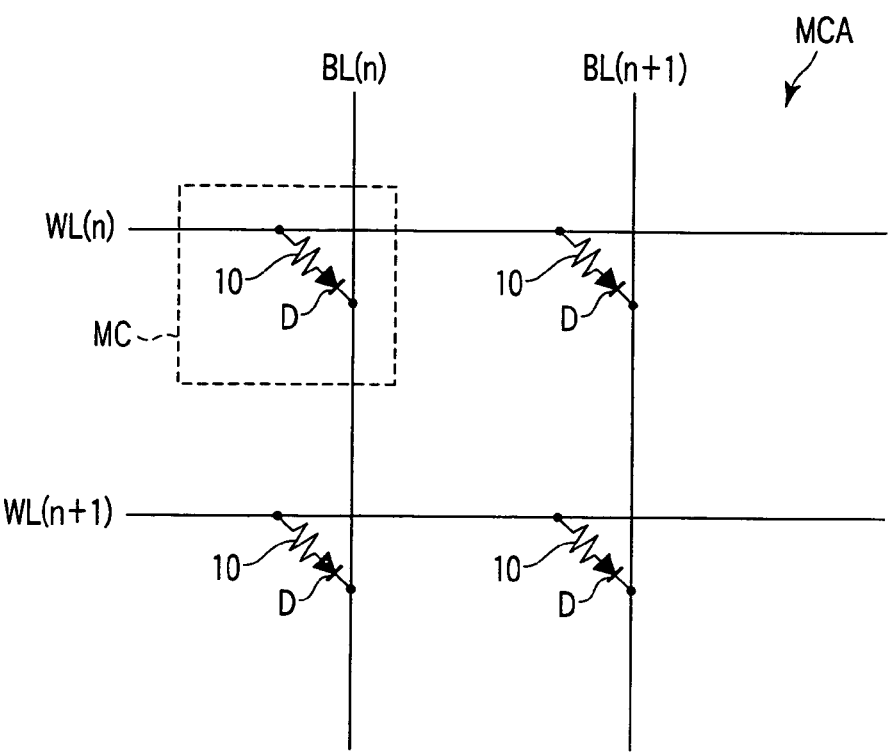
F I G. 25
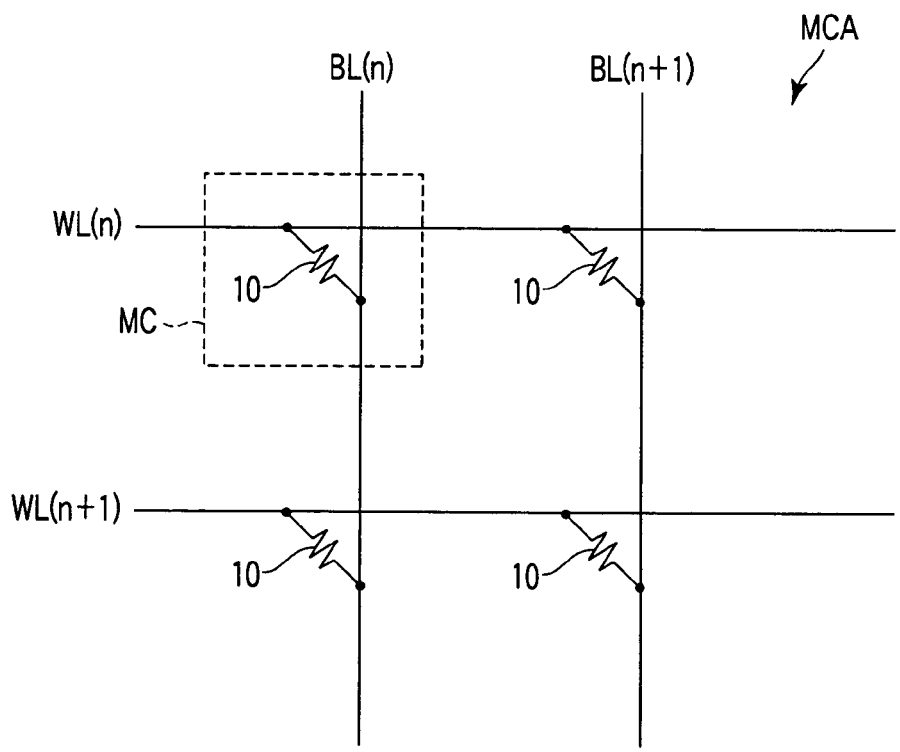
F I G. 26

MAGNETIC RECORDING ELEMENT AND MAGNETIC RECORDING DEVICE USING THE SAME

CROSS-REFERENCE TO RELATED APPLICATIONS

This application is based upon and claims the benefit of priority from prior Japanese Patent Applications No. 2004-272298, filed Sep. 17, 2004; and No. 2005-106439, filed Apr. 1, 2005, the entire contents of both of which are incorporated herein by reference.

BACKGROUND OF THE INVENTION

1. Field of the Invention

The present invention relates to a magnetic recording element and magnetic recording device and, more particularly, to a magnetic recording element capable of executing a write by supplying a spin-polarized electron, and a magnetic recording device using the same.

2. Description of the Related Art

To control the magnetization direction of a magnetic material, a method of applying a magnetic field has conventionally been employed. In, e.g., a hard disk drive, the magnetization direction of the medium is reversed by a magnetic field generated from the recording head, thereby executing a write. In a solid-state magnetic recording device (MRAM: Magnetic Random Access Memory), a current magnetic field generated by supplying a current to a wiring line arranged near a magnetoresistive element is applied to a cell to control its magnetization direction. These magnetization direction control methods (current magnetic field write methods) utilizing an external magnetic field have a long history and are regarded as established techniques.

Along with the recent progress in nanotechnology, magnetic materials can also noticeably be microfabricated. Accordingly, magnetization control must also locally be done on a nanoscale. However, localization is difficult because a magnetic field fundamentally spreads spatially. As the bit or cell size decreases, the problem of "crosstalk" becomes conspicuous. That is, even when a specific bit or cell is selected, and its magnetization direction is controlled, the magnetic field spreads to adjacent bits or cells. If the magnetic field generation source is made small to localize the magnetic field, no sufficient magnetic field can be generated.

Recently, a "current direct driving magnetization reversal phenomenon" which causes magnetization reversal by supplying a current to a magnetic material has been found (e.g., F. J. Albert, et al., Appl. Phy. Lett. 77, 3809 (2000)).

In this "current direct driving magnetization reversal phenomenon", a current is supplied to a magnetic layer to spin-polarize electrons. The spin-polarized electrons are caused to pass through the target magnetic layer to reverse its magnetization. More specifically, when the angular momentum of the spin-polarized electrons is transmitted to and acts on the angular momentum of the magnetic material whose magnetization is to be reversed, the magnetization direction of the magnetic material is reversed. When this phenomenon is used, the current can be caused to more directly act on a magnetic material on a nanoscale, as compared to the above-described current magnetic field write methods. Hence, recording on a magnetic material with a finer structure is possible.

However, when the "current direct driving magnetization reversal phenomenon" is used, the current necessary for magnetization reversal is large. Accordingly, the element characteristic degrades due to the influence of heat generated by the reversal current, resulting in a problem of reliability. In addition, a reversal current Jc– for switching from parallel to anti-parallel is larger by several times than a reversal current Jc+ for switching from anti-parallel to parallel. To solve the asymmetry of the reversal currents Jc– and Jc+, the reversal current Jc– for switching from parallel to anti-parallel must be small.

BRIEF SUMMARY OF THE INVENTION

A magnetic recording element according to a first aspect of the present invention is a magnetic recording element in which information is recorded by supplying to a magnetic material a spin-polarized electron which is spin-polarized, comprising a fixed layer whose magnetization is substantially fixed, which has a first surface and a second surface, and is essentially made of a ferromagnetic material, a recording layer whose magnetization is reversed by an action of the spin-polarized electron, which has a third surface and a fourth surface, and is essentially made of a ferromagnetic material having a first atomic potential for the majority-spin band electrons and a second atomic potential for the minority-spin band electrons, a spacer layer which is arranged between the fixed layer and the recording layer, is in contact with the second surface and the third surface, and is essentially made of a nonmagnetic material, a cap layer which has a fifth surface and a sixth surface, is essentially made of a nonmagnetic material having a third atomic potential less than an intermediate value between the first atomic potential and the second atomic potential, and has a thickness of not more than 3 nm, the fifth surface being in contact with the fourth surface, and a reflecting layer which is in contact with the sixth surface, is essentially made of a nonmagnetic material having a forth atomic potential different from the third atomic potential, and has a thickness of not more than 20 nm.

A magnetic recording device according to a second aspect of the present invention comprises a memory cell comprising the magnetic recording element according to the first aspect.

BRIEF DESCRIPTION OF THE SEVERAL VIEWS OF THE DRAWING

FIGS. 2A and 2B are explanatory views of a mechanism which reduces the reversal current density when the magnetic recording element according to the first embodiment of the present invention is used, in which FIG. 2A is a view showing the layered structure of the magnetic recording element shown in FIG. 1 which is rotated by 90°, and FIG. 2B is a schematic view showing the atomic potentials for electrons in the respective layers of the magnetic recording element shown in FIG. 2A;

FIG. 5A is a graph showing the relationship between the strength of electron confinement in the cap layer and the change of the thickness of the cap layer in the magnetic recording element according to the first embodiment of the present invention;

FIG. 5B is a graph showing the relationship between the strength of electron confinement in the cap layer and the change of the thickness of the reflecting layer in the magnetic recording element according to the first embodiment of the present invention;

FIGS. 6A to 6D are sectional views showing a case in which one of the fixed layer and recording layer of the magnetic recording element according to the first embodiment of the present invention has an anti-ferromagnetic coupling structure or ferromagnetic coupling structure, in which FIG. 6A shows a case in which the recording layer has an anti-ferromagnetic coupling structure, FIG. 6B shows a case in which the fixed layer has an anti-ferromagnetic coupling structure, FIG. 6C shows a case in which the recording layer has a ferromagnetic coupling structure, and FIG. 6D shows a case in which the fixed layer has a ferromagnetic coupling structure;

FIGS. 7A to 7D are sectional views showing a case in which both the fixed layer and the recording layer of the magnetic recording element according to the first embodiment of the present invention have an anti-ferromagnetic coupling structure or ferromagnetic coupling structure, in which FIG. 7A shows a case in which the recording layer and fixed layer have an anti-ferromagnetic coupling structure, FIG. 7B shows a case in which the recording layer and fixed layer have a ferromagnetic coupling structure, FIG. 7C shows a case in which the recording layer has an anti-ferromagnetic coupling structure, and the fixed layer has a ferromagnetic coupling structure, and FIG. 7D shows a case in which the recording layer has a ferromagnetic coupling structure, and the fixed layer has an anti-ferromagnetic coupling structure;

FIGS. 8A and 8B are sectional views showing multilayered structures of magnetic layers in the magnetic recording element according to the first embodiment of the present invention, in which FIG. 8A shows a case in which the recording layer has a two-layered structure, and FIG. 8B shows a case in which the fixed layer has a two-layered structure;

FIGS. 9A and 9B are sectional views showing multilayered structures of magnetic layers in the magnetic recording element according to the first embodiment of the present invention, in which FIG. 9A shows a case in which the recording layer has a three-layered structure, and FIG. 9B shows a case in which the fixed layer has a three-layered structure;

FIGS. 10A and 10B are sectional views of the magnetic recording element according to the first embodiment of the present invention, in which FIG. 10A shows a trapezoidal shape, and FIG. 10B shows a convex shape;

FIGS. 11A to 11H are plan views of the magnetic recording element according to the first embodiment of the present invention, in which FIG. 11A shows a square, FIG. 11B shows a rectangle, FIG. 11C shows a hexagon long in the horizontal (vertical) direction, FIG. 11D shows an elliptical shape, FIG. 11E shows a rhombic shape, FIG. 11F shows a parallelogram, FIG. 11G shows a circle, and FIG. 11H shows a cross;

FIGS. 12A and 12B are views for explaining a case in which magnetization is reversed from a parallel magnetization arrangement to an anti-parallel magnetization arrangement in a write operation by current direct driving using the magnetic recording element according to the first embodiment of the present invention, in which FIG. 12A is a schematic view of the magnetic recording element, and FIG. 12B is a schematic view of the atomic potentials;

FIGS. 13A and 13B are views for explaining a case in which magnetization is reversed from an anti-parallel magnetization arrangement to a parallel magnetization arrangement in a write operation by current direct driving using the magnetic recording element according to the first embodiment of the present invention, in which FIG. 13A is a schematic view of the magnetic recording element, and FIG. 13B is a schematic view of the atomic potentials;

FIGS. 15A and 15B are graphs showing comparison of the effects of samples 1 and 2 in the first example of the first embodiment of the present invention, in which FIG. 15A is a graph showing the current write characteristic, and FIG. 15B is a graph showing the reversal current density;

FIGS. 19A and 19B are views for explaining the write operation of the magnetic recording device according to the second embodiment of the present invention, in which FIG. 19A shows a "0" write, and FIG. 19B shows a "1" write;

FIGS. 20A and 20B are views for explaining the read operation of the magnetic recording device according to the second embodiment of the present invention, in which FIG. 20A shows a "0" read, and FIG. 20B shows a "1" read;

FIG. 21 is a circuit diagram showing the equivalent circuit of the memory cell array of a magnetic recording device according to the third embodiment of the present invention;

FIG. 22 is a schematic view showing the sectional structure of one memory cell in FIG. 21;

FIGS. 23A and 23B are views for explaining the write operation of the magnetic recording device according to the third embodiment of the present invention, in which FIG. 23A shows a "0" write, and FIG. 23B shows a "1" write;

FIGS. 24A and 24B are views for explaining the read operation of the magnetic recording device according to the third embodiment of the present invention, in which FIG. 24A shows a "0" read, and FIG. 24B shows a "1" read;

FIG. 25 is a circuit diagram showing the equivalent circuit of the memory cell array of a magnetic recording device according to the fourth embodiment of the present invention;

FIG. 26 is a circuit diagram showing the equivalent circuit of the memory cell array of a magnetic recording device according to the fifth embodiment of the present invention;

DETAILED DESCRIPTION OF THE INVENTION

Figure 1:
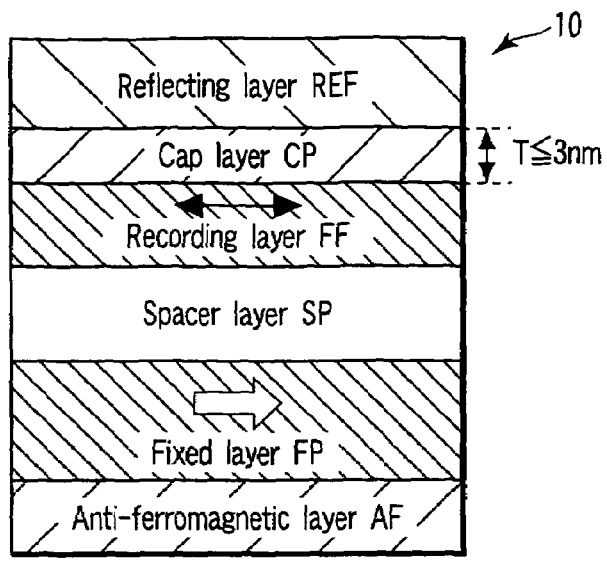
FIG. 1 is a schematic view showing the sectional structure of a magnetic recording element according to the first embodiment of the present invention.

The embodiments of the present invention will be described below with reference to the accompanying drawing. The same reference numerals denote the same parts throughout the drawing.

FIRST EMBODIMENT

FIG. 1 is a schematic view showing the sectional structure of a magnetic recording element according to the first embodiment of the present invention.

As shown in FIG. 1, a magnetic recording element 10 has a layered structure in which an anti-ferromagnetic layer AF, fixed layer (pinned layer) FP, spacer layer SP, recording layer (free layer) FF, cap layer CP, and reflecting layer REF are sequentially formed. A thickness T of the cap layer CP is very thin and is set to 3 nm or less. The cap layer CP is made of a material having an atomic potential (a potential) less than the intermediate value between the atomic potential for the majority-spin band electrons and the atomic potential for the minority-spin band electrons of the recording layer FF.

The present inventors found that according to the magnetic recording element 10, the reversal current for magnetization reversal from parallel to anti-parallel in magnetization reversal by current direct driving can be reduced, and the asymmetry of the reversal currents can be solved. The evidence for this will be described below in detail.

The reason why the material of the cap layer CP is defined as a material whose atomic potential is less than the intermediate value between the atomic potential for the majority-spin electrons and the atomic potential for the minority-spin electrons of the recording layer FF, and the cap layer CP is formed as a thin film is as follows.

Figure 2A:
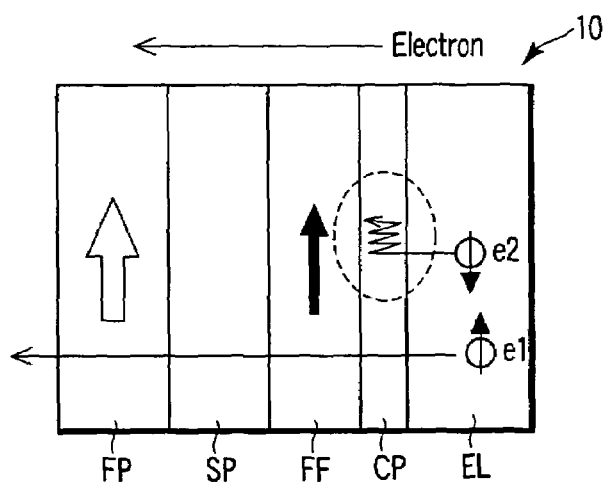
Figure 2B:
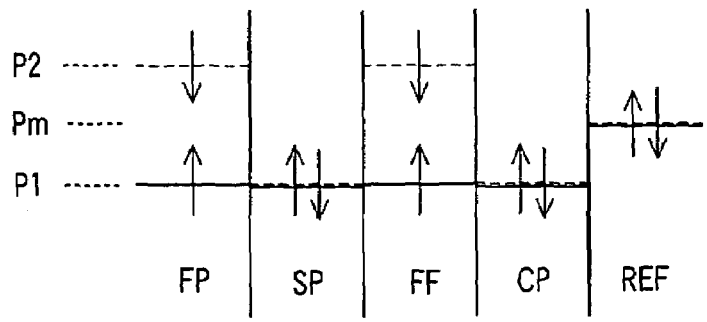

FIGS. 2A and 2B are explanatory views of a mechanism which reduces the reversal current density when the magnetic recording element according to the first embodiment of the present invention is used. FIG. 2A is a view showing the layered structure of the magnetic recording element shown in FIG. 1 which is rotated by 90°. FIG. 2B is a schematic view showing the atomic potentials for electrons in the respective layers of the magnetic recording element shown in FIG. 2A.

The magnetic recording element 10 shown in FIG. 2A has a parallel magnetization arrangement. More specifically, the magnetization direction of the fixed layer FP and that of the recording layer FF are parallel (same direction). Referring to FIG. 2A, the two layers are magnetized upward on the drawing surface.

The layers of the magnetic recording element 10 have potentials shown in FIG. 2B. More specifically, in the fixed layer FP and recording layer FF made of a ferromagnetic material, an atomic potential P1 for upward spin-polarized electrons (↑) is different from an atomic potential P2 for downward spin-polarized electrons (↓). On the other hand, in the spacer layer SP, cap layer CP, and reflecting layer REF made of a nonmagnetic material, the potential P1 of the upward spin-polarized electrons equals the potential P2 of the downward spin-polarized electrons. In this example, the magnetization direction of the fixed layer FP and recording layer FF is upward. Hence, in the fixed layer FP and recording layer FF, upward spin is majority-spin, and downward spin is minority-spin.

In this embodiment, the atomic potential for electrons of the cap layer CP is less than the intermediate value between the atomic potential for the majority-spin band electrons and that for the minority-spin band electrons of the recording layer FF. More specifically, the potential for the upward spin-polarized electrons and downward spin-polarized electrons in the cap layer CP is less than an intermediate value Pm between the potential P1 of the upward spin electrons (the potential for the majority-spin band electrons) and the potential P2 of the downward spin electrons (the potential for the minority-spin band electrons) of the recording layer FF. In the example shown in FIG. 2B, the potential of the cap layer CP equals the potential P1. It is to be desired that the difference between the potential of the reflecting layer REF and that of the cap layer CP is large. In the example shown in FIG. 2B, the potential of the reflecting layer REF almost equals the intermediate value Pm.

As described above, when the atomic potential for electrons of the cap layer CP is close to that of the majority-spin band electrons (upward spin electrons) of the recording layer FF, the downward spin-polarized electrons in the cap layer CP are readily confined between the recording layer FF and reflecting layer REF.

More specifically, when electrons are supplied from the reflecting layer REF to the recording layer FF, an upward spin-polarized electron e1 has almost the same potential as that of an upward spin-polarized electron (majority-spin-polarized electron) in the recording layer FF and readily enters the recording layer FF. However, a downward spin-polarized electron e2 has a potential lower than that of a downward spin-polarized electron (minority-spin-polarized electron) in the recording layer FF and is reflected by the surface of the recording layer FF (the interface between the recording layer FF and the cap layer CP). The reflected downward spin-polarized electron e2 is reflected by the surface of the reflecting layer REF (the interface between the cap layer CP and the reflecting layer REF) again because the potential of the cap layer CP and that of the reflecting layer REF are different.

When the thickness T of the cap layer CP is very thin and is set to 3 nm or less and the reflecting layer REF acts as a reflector for the electrons, the multiple reflection effect caused by the two interfaces becomes prominent. As a result, the downward spin-polarized electrons e2 are confined in the cap layer CP. The confined downward spin-polarized electrons e2 act on the recording layer FF and promote magnetization reversal in the recording layer FF. For this reason, especially when the electrons are to be supplied from the recording layer FF to the fixed layer FP, i.e., when the recording layer FF is to be switched from the parallel magnetization arrangement to the anti-parallel magnetization arrangement, the reversal current density can be reduced.

Figure 3:
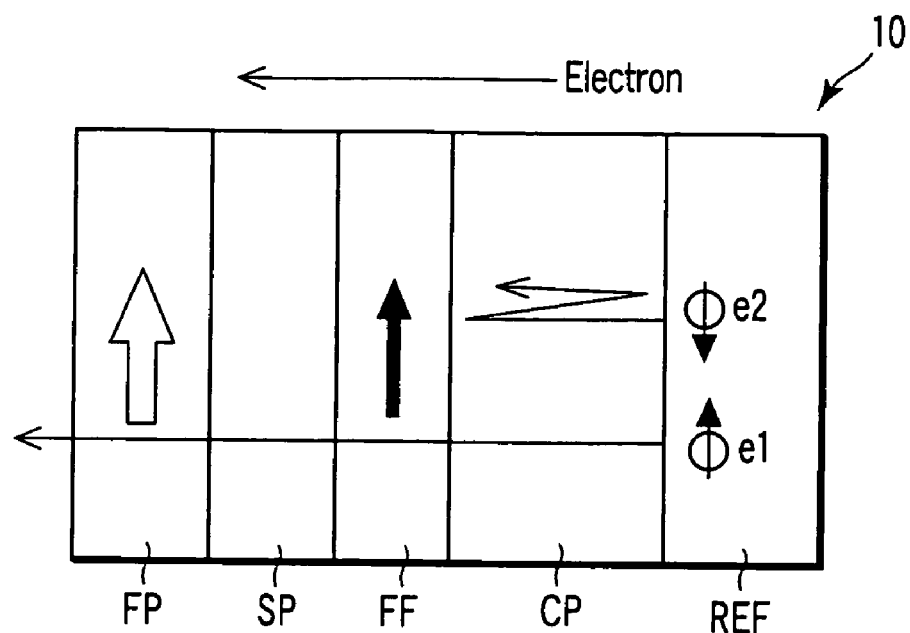
FIG. 3 is a view for explaining an example in which no sufficient electron confinement effect is obtained when a magnetic recording element having a thick cap layer is used.
Figure 4:
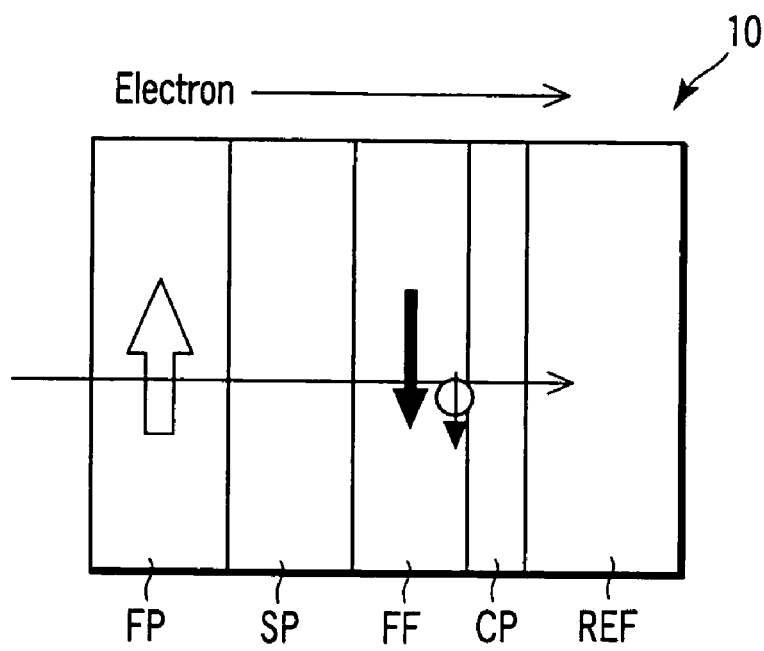
FIG. 4 is a view showing a case in which electrons are supplied from the fixed layer to the recording layer in the magnetic recording element according to the first embodiment of the present invention.

To the contrary, when the cap layer CP is thick, as shown in FIG. 3, the downward spin-polarized electrons e2 cannot sufficiently be confined. When the electrons flow from the fixed layer FP to the recording layer FF in a reverse direction, as shown in FIG. 4, confinement of the minority-spin-polarized electrons in the cap layer CP does not occur, and no effect is applied to the recording layer FF.

The reason why the thickness T of the cap layer CP is set to 3 nm or less is as follows.

FIG. 5A shows the relationship between the strength of electron confinement in the cap layer and the change of the thickness of the cap layer. This relationship was obtained in the following way. Cu layers (cap layers CP) having various thicknesses were added to a Co/Cu/Co sandwiched film, and the interlayer exchange interaction between the two Co layers was obtained. An oscillation component was removed from the result, thereby obtaining the strength of the electron confinement effect in the cap layer CP.

As shown in FIG. 5A, the strength of the electron confinement in the cap layer CP decreases as the thickness T of the cap layer CP increases, and becomes almost zero when the thickness T of the cap layer CP is about 3 nm. Hence, it is to be desired that the thickness T of the cap layer CP is 3 nm or less.

The thinner the cap layer CP is, the more advantageous its becomes. As a example, the thickness T of the cap layer CP satisfies 0.2 nm≦T≦3 nm. The upper limit value (3 nm) is defined on the basis of the above-described reason. The lower limit value (0.2 nm) is defined on the basis of an idea that it is to be desired that at least one atom exists to form the cap layer CP. The thickness T of the cap layer CP can be smaller than 0.2 nm, as a matter of course.

The thinner the cap layer CP is, the more advantageous its becomes. As another example, the thickness T of the cap layer CP can satisfy 0.2 nm≦T≦2 nm. The lower limit value (0.2 nm) is defined on the basis of the above-described reason. The upper limit value (2 nm) is defined in consideration of a case in which the electron confinement effect may attenuate at the thickness T smaller than 3 nm depending on the magnetic recording element manufacturing method.

As for the reflecting layer REF, to obtain a sufficient reflecting effect, the thickness of the reflecting layer is preferably 20 nm or less. FIG. 5B shows a change in strength of electron confinement in the cap layer in accordance with a change in thickness of the reflecting layer using Ta. As is apparent from FIG. 5B, the strength of electron confinement in the cap layer CP increases when the thickness of the reflecting layer is 20 nm or less.

When an insulating layer represented by an oxide or nitride is used as the reflecting layer, a larger reflecting effect can be obtained. In this case, the thickness of the reflecting layer is preferably 1 nm or less. If the reflecting layer is thicker, the element resistance becomes too high, and the current necessary for reversal cannot be supplied. When the thickness is 1 nm or less, the insulating layer need not always be a continuous film and may contain pinholes.

(a) Structure of Magnetic Recording Element (a-1) Anti-Ferromagnetic Coupling Structure and Ferromagnetic Coupling Structure In the magnetic recording element 10 according to this embodiment, each of the recording layer FF and fixed layer FP may have either a single magnetic layer or a layered structure of magnetic layer/nonmagnetic layer/magnetic layer, i.e., a structure with a nonmagnetic layer inserted between magnetic layers. Detailed examples of the layered structure will be described below.

FIGS. 6A to 6D and 7A to 7D are sectional views of magnetic recording elements having the anti-ferromagnetic coupling structure and ferromagnetic coupling structure according to this embodiment. In the anti-ferromagnetic coupling structure, a magnetic coupling occurs such that the magnetization directions of two ferromagnetic layers which sandwich a nonmagnetic layer are anti-parallel. In the ferromagnetic coupling structure, magnetic coupling occurs such that the magnetization directions of two ferromagnetic layers which sandwich a nonmagnetic layer are parallel.

Figure 6A:
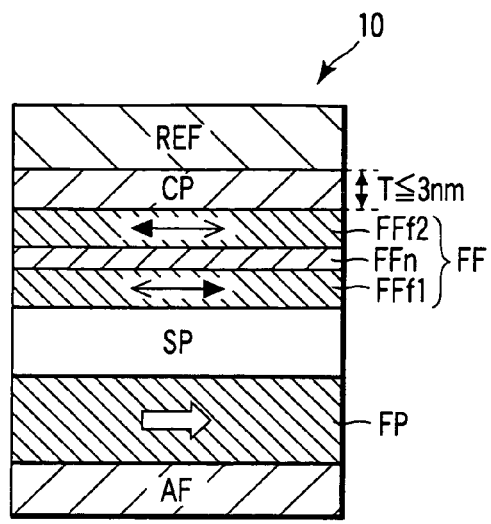

In the magnetic recording element 10 shown in FIG. 6A, the recording layer FF has the anti-ferromagnetic coupling structure. More specifically, the recording layer FF has a three-layered structure including a ferromagnetic layer FFf1, nonmagnetic layer FFn, and ferromagnetic layer FFf2. They are magnetically coupled such that the magnetization directions of the ferromagnetic layers FFf1 and FFf2 are set in the anti-parallel state.

Figure 6B:
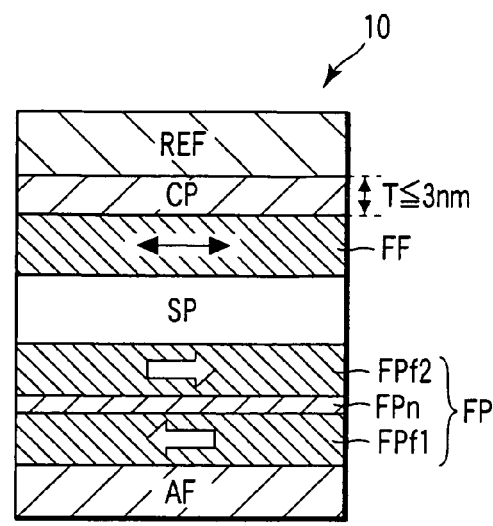

In the magnetic recording element 10 shown in FIG. 6B, the fixed layer FP has the anti-ferromagnetic coupling structure. More specifically, the fixed layer FP has a three-layered structure including a ferromagnetic layer FPf1, nonmagnetic layer FPn, and ferromagnetic layer FPf2. They are magnetically coupled such that the magnetization directions of the ferromagnetic layers FPf1 and FPf2 are set in the anti-parallel state.

Figure 6C:
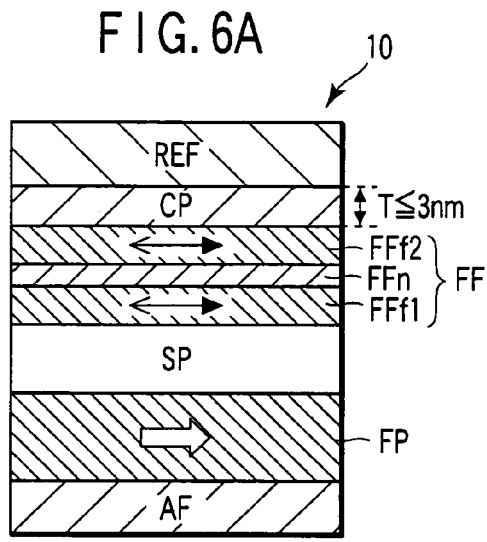

In the magnetic recording element 10 shown in FIG. 6C, the recording layer FF has the ferromagnetic coupling structure. More specifically, the recording layer FF has a three-layered structure including the ferromagnetic layer FFf1, nonmagnetic layer FFn, and ferromagnetic layer FFf2. They are magnetically coupled such that the magnetization directions of the ferromagnetic layers FFf1 and FFf2 are set in the parallel state.

Figure 6D:
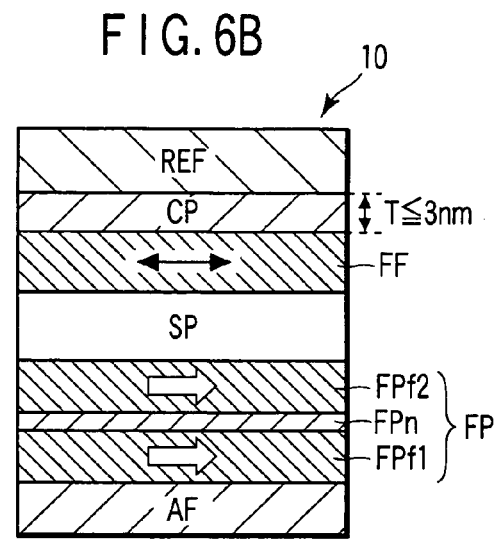

In the magnetic recording element 10 shown in FIG. 6D, the fixed layer FP has the ferromagnetic coupling structure. More specifically, the fixed layer FP has a three-layered structure including the ferromagnetic layer FPf1, nonmagnetic layer FPn, and ferromagnetic layer FPf2. They are magnetically coupled such that the magnetization directions of the ferromagnetic layers FPf1 and FPf2 are set in the parallel state.

Figure 7A:
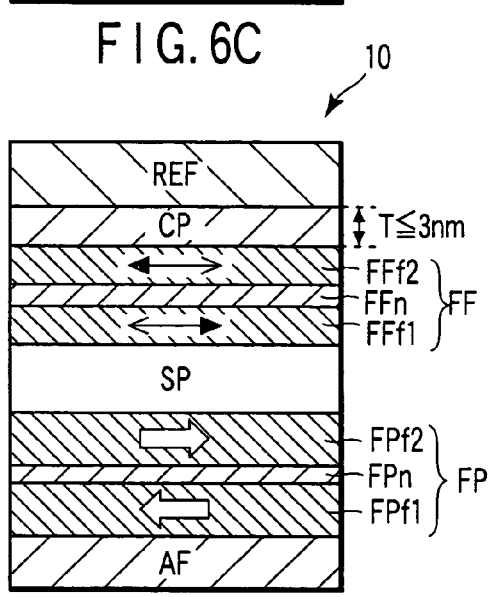

In the magnetic recording element 10 shown in FIG. 7A, both the recording layer FF and the fixed layer FP have the anti-ferromagnetic coupling structure. More specifically, the recording layer FF has a three-layered structure including the ferromagnetic layer FFf1, nonmagnetic layer FFn, and ferromagnetic layer FFf2. They are magnetically coupled such that the magnetization directions of the ferromagnetic layers FFf1 and FFf2 are set in the anti-parallel state. The fixed layer FP has a three-layered structure including the ferromagnetic layer FPf1, nonmagnetic layer FPn, and ferromagnetic layer FPf2. They are magnetically coupled such that the magnetization directions of the ferromagnetic layers FPf1 and FPf2 are set in the anti-parallel state.

Figure 7B:
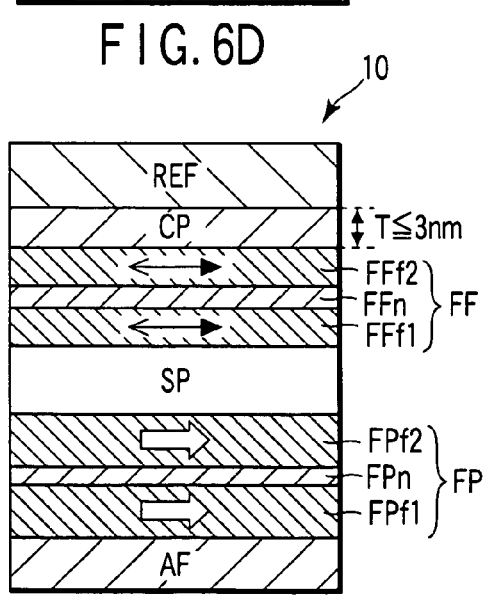

In the magnetic recording element 10 shown in FIG. 7B, both the recording layer FF and the fixed layer FP have the ferromagnetic coupling structure. More specifically, the recording layer FF has a three-layered structure including the ferromagnetic layer FFf1, nonmagnetic layer FFn, and ferromagnetic layer FFf2. They are magnetically coupled such that the magnetization directions of the ferromagnetic layers FFf1 and FFf2 are set in the parallel state.

The fixed layer FP has a three-layered structure including the ferromagnetic layer FPf1, nonmagnetic layer FPn, and ferromagnetic layer FPf2. They are magnetically coupled such that the magnetization directions of the ferromagnetic layers FPf1 and FPf2 are set in the parallel state.

Figure 7C:
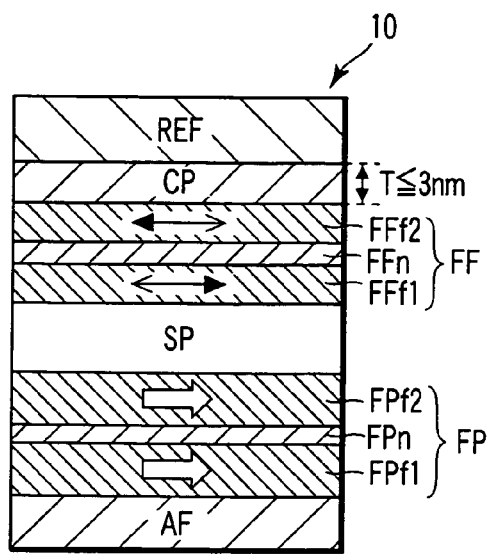

In the magnetic recording element 10 shown in FIG. 7C, the recording layer FF has the anti-ferromagnetic coupling structure, and the fixed layer FP has the ferromagnetic coupling structure. More specifically, the recording layer FF has a three-layered structure including the ferromagnetic layer FFf1, nonmagnetic layer FFn, and ferromagnetic layer FFf2. They are magnetically coupled such that the magnetization directions of the ferromagnetic layers FFf1 and FFf2 are set in the anti-parallel state. The fixed layer FP has a three-layered structure including the ferromagnetic layer FPf1, nonmagnetic layer FPn, and ferromagnetic layer FPf2. They are magnetically coupled such that the magnetization directions of the ferromagnetic layers FPf1 and FPf2 are set in the parallel state.

Figure 7D:
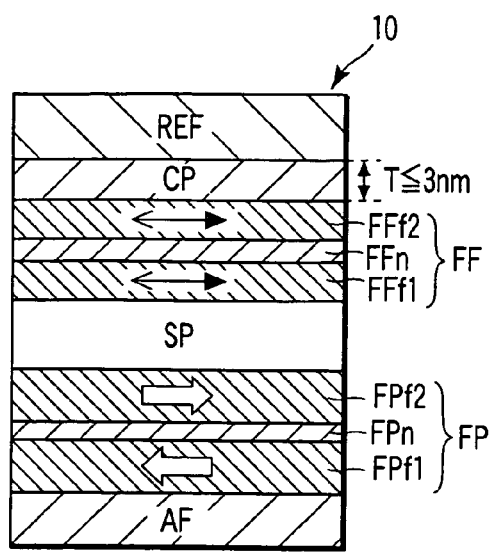

In the magnetic recording element 10 shown in FIG. 7D, the recording layer FF has the ferromagnetic coupling structure, and the fixed layer FP has the anti-ferromagnetic coupling structure. More specifically, the recording layer FF has a three-layered structure including the ferromagnetic layer FFf1, nonmagnetic layer FFn, and ferromagnetic layer FFf2. They are magnetically coupled such that the magnetization directions of the ferromagnetic layers FFf1 and FFf2 are set in the parallel state. The fixed layer FP has a three-layered structure including the ferromagnetic layer FPf1, nonmagnetic layer FPn, and ferromagnetic layer FPf2. They are magnetically coupled such that the magnetization directions of the ferromagnetic layers FPf1 and FPf2 are set in the anti-parallel state.

Even in the structures shown in FIGS. 6A to 6D and 7A to 7D, when the thickness T of the cap layer CP is very thin and is set to 3 nm or less, and the cap layer CP is made of a material having an atomic potential less than the intermediate value between the atomic potential for the majority-spin band electrons and the atomic potential for the minority-spin band electrons of the recording layer FF, and the reflecting layer REF has a thickness of not more than 20 nm, a reversal current Jc− can be reduced, and the asymmetry of reversal currents Jc− and Jc+ can be solved. In addition, in the layered structure of ferromagnetic layer/nonmagnetic layer/ferromagnetic layer, the reversal current Jc− can further be reduced. In addition, the leakage magnetic field from the ferromagnetic layer is small, and the characteristic of the magnetic recording element 10 stabilizes.

In the layered structure of ferromagnetic layer/nonmagnetic layer/ferromagnetic layer, interlayer coupling of the ferromagnetic layers through the nonmagnetic layer oscillates with anti-ferromagnetic coupling or ferromagnetic coupling in accordance with the thickness of the nonmagnetic layer. Hence, the thickness of the nonmagnetic layer is selected such that anti-ferromagnetic coupling or ferromagnetic coupling is obtained. When the recording layer FF has the layered structure of ferromagnetic layer/nonmagnetic layer/ferromagnetic layer, a material which interlayer-exchange-couples to the cap layer CP is selected. The number of layers in the layered structure of ferromagnetic layer/nonmagnetic layer/ferromagnetic layer is not limited to three and may be increased.

(a-2) Multilayered Structure of Magnetic Layer

In the magnetic recording element 10 according to this embodiment, at least one of the recording layer FF and fixed layer FP may have a multilayered structure including a plurality of magnetic layers.

FIGS. 8A, 8B, 9A, and 9B are sectional views of multi-layered structures including magnetic layers in the magnetic recording element according to this embodiment.

Figure 8A:
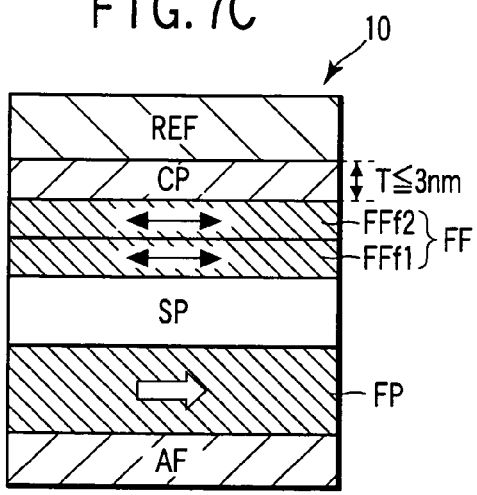

In the magnetic recording element shown in FIG. 8A, the recording layer FF has a two-layered structure including the ferromagnetic layer FFf1 and ferromagnetic layer FFf2.

Figure 8B:
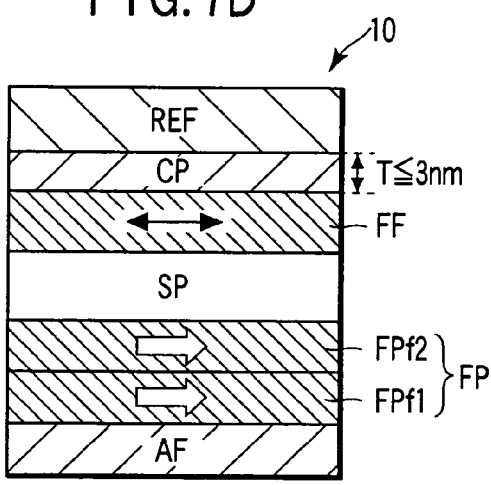

In the magnetic recording element shown in FIG. 8B, the fixed layer FP has a two-layered structure including the ferromagnetic layer FPf1 and ferromagnetic layer FPf2.

Figure 9A:
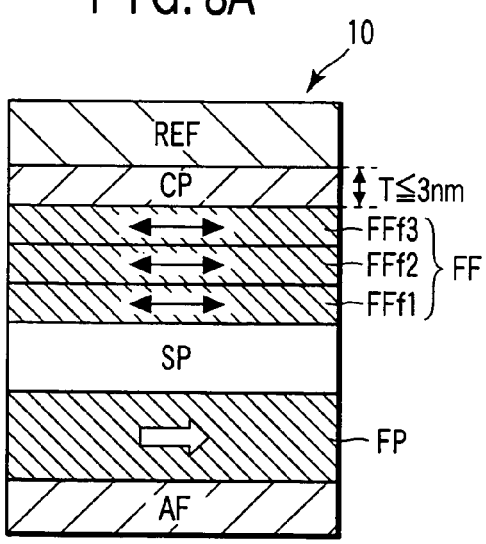

In the magnetic recording element shown in FIG. 9A, the recording layer FF has a three-layered structure including the ferromagnetic layer FFf1, ferromagnetic layer FFf2, and ferromagnetic layer FFf3.

Figure 9B:
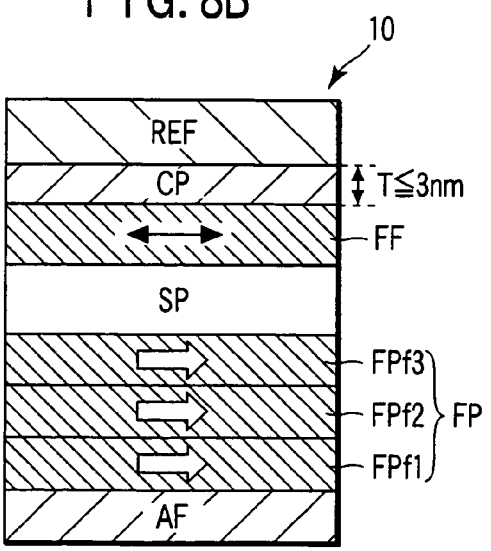

In the magnetic recording element shown in FIG. 9B, the fixed layer FP has a three-layered structure including the ferromagnetic layer FPf1, ferromagnetic layer FPf2, and ferromagnetic layer FPf3.

Even in the structures shown in FIGS. 8A, 8B, 9A, and 9B, when the thickness of the cap layer CP is very thin and is set to 3 nm or less, and the cap layer CP is made of a material having an atomic potential less than the intermediate value between the atomic potential for the majority-spin band electrons and the atomic potential for the minority-spin band electrons of the recording layer FF, and the reflecting layer REF has a thickness of not more than 20 nm, the reversal current Jc− can be reduced, and the asymmetry of the reversal currents Jc− and Jc+ can be solved. In addition, in the multilayered structure of magnetic layers, the reversal current Jc− can further be reduced.

The multilayered structure of magnetic layers is not limited to the two-layered structure and three-layered structure. The multilayered structure may include four or more layers. The number of layers in the multilayered structure of the recording layer FF and that of the fixed layer FP may be the same or different. The multilayered structure of magnetic layers may be combined with the above-described anti-ferromagnetic coupling structure or ferromagnetic coupling structure.

(a-3) Sectional Shape

In the sectional shape of the magnetic recording element 10 according to this embodiment, the sizes of the layers are the same in the direction of the film surface (direction of axis of easy or hard magnetization). However, the present invention is not limited to this. The layers may have different sizes for wiring or control of the magnetization directions. For example, the sectional shape of the magnetic recording element 10 may be trapezoidal so that the size in the widthwise direction is continuously reduced toward the top, as shown in FIG. 10A. Alternatively, the sizes in the widthwise direction may be discontinuous (e.g., convex), as shown in FIG. 10B. In this case as well, the effect of the embodiment can be obtained without any problem.

(a-4) Planar Shape

It is to be desired that the planar shape of the magnetic recording element 10 (mainly the recording layer) according to this embodiment is a square or rectangle (FIG. 11A or 11B) whose aspect ratio falls within the range from 1:1 to 1:5, a hexagon long in the horizontal (vertical) direction (FIG. 11C), an elliptical shape (FIG. 11D), a rhombic shape (FIG. 11E), or a parallelogram (FIG. 11F). The planar shape may be a circle (FIG. 11G) or a cross (FIG. 11H). As the size of the planar shape of the recording layer, it is to be desired that the sides in the longitudinal direction (direction of axis of easy magnetization) fall within the range of about 5 nm to 500 nm.

(b) Elements of Magnetic Recording Element

The elements (mainly materials) included in the magnetic recording element 10 according to this embodiment will be described in detail.

(b-1) Fixed Layer FP and Recording Layer FF

As the ferromagnetic material of the fixed layer FP and recording layer FF, a material having a magnetic characteristic corresponding to the application purpose is appropriately selected from the following materials.

For example, "iron (Fe) simple substance", "cobalt (Co) simple substance", "nickel (Ni) simple substance", an "alloy containing at least one element selected from the group consisting of iron (Fe), cobalt (Co), nickel (Ni), manganese (Mn), and chromium (Cr)", an "NiFe-based alloy called permalloy", a "soft magnetic material such as a CoNbZr-based alloy, FeTaC-based alloy, CoTaZr-based alloy, FeAlSi-based alloy, FeB-based alloy, or CoFeB-based alloy", or a "Heusler alloy, magnetic semiconductor, or half-metal magnetic oxide (or half-metal magnetic nitride) such as $CrO_2$, $Fe_3O_4$, or $La_{1-x}Sr_xMnO_3$," can be used.

As the "magnetic semiconductor", a material containing at least one of magnetic elements including iron (Fe), cobalt (Co), nickel (Ni), chromium (Cr), and manganese (Mn) and a compound semiconductor or oxide semiconductor can be used. Detailed examples of the magnetic semiconductor are (Ga, Cr)N, (Ga, Mn)N, MnAs, CrAs, (Ga, Cr)As, ZnO:Fe, (Mg, Fe)O, Ti—O:Co.

As the material used for the fixed layer FP and recording layer FF, a continuous magnetic material may be used. Alternatively, a complex structure formed by segregating or forming fine particles of a magnetic material in a nonmagnetic matrix may be used. An example of the complex structure is a "granular magnetic material".

The anti-ferromagnetic coupling structure and ferromagnetic coupling structure shown in FIGS. 6A to 6D and 7A to 7D can use the following materials. For example, in the recording layer FF and fixed layer FP including the magnetic layer/nonmagnetic layer/magnetic layer with anti-ferromagnetic coupling, a nonmagnetic metal layer such as ruthenium (Ru), iridium (Ir), or chromium (Cr) and an anti-ferromagnetic material are used as the nonmagnetic layer. To obtain anti-ferromagnetic coupling, it is to be desired that the thickness of the nonmagnetic layer is set to, e.g., 0.2 to 3 nm.

The multilayered structures of magnetic layers shown in FIGS. 8A, 8B, 9A, and 9B can use the following materials. For example, as the material of the fixed layer FP and recording layer FF, a two-layered structure containing [(Co or CoFe alloy)/(NiFe, permalloy containing NiFeCo, or Ni)] or a three-layered structure containing [(Co or CoFe alloy)/(NiFe, permalloy containing NiFeCo, or Ni)/(Co or CoFe alloy)] can be used. In the magnetic layer having such a multilayered structure, the thickness of the outer Co or CoFe alloy falls within the range of 0.2 to 1 nm, for example. This is because a large playback signal output or high reversal efficiency can be obtained in this range.

(b-2) Anti-Ferromagnetic Layer AF

The anti-ferromagnetic layer AF is formed in direct contact with the fixed layer FP to add a unidirectional anisotropy to the fixed layer FP and fix the magnetization of the fixed layer FP. As the material of the anti-ferromagnetic layer AF, ferromanganese (FeMn), platinum-manganese (PtMn), palladium-manganese (PdMn), palladium-platinum-manganese (PdPtMn) or the like is used.

(b-3) Spacer Layer SP

The spacer layer SP is made of a nonmagnetic material. Any metals, insulating materials, and semiconductors can be used as the material of the spacer layer SP. These materials can be classified into two types: low-resistance material and high-resistance material.

Examples of the low-resistance material are copper (Cu), gold (Au), silver (Ag), aluminum (Al), and an alloy containing at least one of copper (Cu), gold (Au), silver (Ag), aluminum (Al). The magnetization reversal effect can be obtained when the thickness of the spacer layer SP made of such a low-resistance nonmagnetic material is, e.g., about 1 to 60 nm.

Examples of the high-resistance material are an insulating material including an oxide (e.g., alumina ($Al_2O_{3-X}$), magnesium oxide (MgO), $SiO_2$, or Si—O—N, Ta—O, Al—Zr—O), nitride, or fluoride containing at least one element selected from the group consisting of aluminum (Al), titanium (Ti), tantalum (Ta), cobalt (Co), nickel (Ni), silicon (Si), magnesium (Mg), and iron (Fe) and a semiconductor such as GaAlAs having a large gap. A large playback output can also be obtained by using a nanocontact MR material prepared by forming pinholes in the insulating material and causing a magnetic layer to enter the pinholes or CPP (Current-Perpendicular-to-Plane)-CCP-MR (Magneto-Resistance effect) material. When the former tunneling magnetoresistive effect insulating material is used, the thickness of the spacer layer SP is set to, e.g., 0.2 to 2 nm for signal playback. When the latter nanocontact MR or CCP-CPP-MR is used, the thickness of the spacer layer SP falls within the range of, e.g., 0.4 to 40 nm.

To detect the output signal by utilizing the magnetoresistive effect of the magnetic recording element 10, an insulating material such as alumina and MgO is used as the spacer layer SP because the change in resistance is large. When Cu, Au, Ag, or an alloy containing at least one of them is used for the spacer layer SP, the life of the element can be prolonged.

(b-4) Cap Layer CP

The cap layer CP is made of a metal nonmagnetic material. The cap layer CP is made of a material having an atomic potential less than the intermediate value between the atomic potential for the majority-spin band electrons and the atomic potential for the minority-spin band electrons of the recording layer FF, as described above. In addition, the material of the cap layer CP has a minimum lattice mismatch to the material of the recording layer FF. Practical examples of the material are Cu, Au, and Ag. The material is determined in accordance with the material of the recording layer FF.

(b-5) Reflecting Layer REF

The reflecting layer REF is made of a nonmagnetic material. It is to be desired that the reflecting layer REF is made of a material having an atomic potential far different from the atomic potential of the cap layer CP (a material having a large potential difference). Detailed examples are Ta, Pt, Ru, Al, and W. The material is determined in accordance with combination with the cap layer CP.

As the reflecting layer REF, an insulating layer having a thickness of 1 nm or less or a semiconductor layer having a thickness of 20 nm or less is used. In this case, electrons can easily be reflected by the reflecting layer REF while maintaining a certain degree of conductivity. Detailed examples are oxides and nitrides such as Ta—O, Al—O, Si—O, Si—O—N, Si—N, Fe—O, Mg—O, Al—Zr—O, Ge—O, and Cu—O and semiconductors such as GaAlAs, Si, Ge, and GaAs. Especially, an insulating layer formed from a very thin film is preferable because it increases the reflecting effect. In this case, the insulating layer need not always be a continuous film. Even a discontinuous film having pinholes can function as a reflecting layer if it is flat.

(c) Write/Read Operation

A write/read operation by current direct driving using the magnetic recording element 10 according to this embodiment will be described with reference to FIGS. 12A, 12B, 13A, and 13B. The magnetization of the fixed layer FP is fixed upward on the drawing surface.

(c-1) Write Operation

Figure 12A:
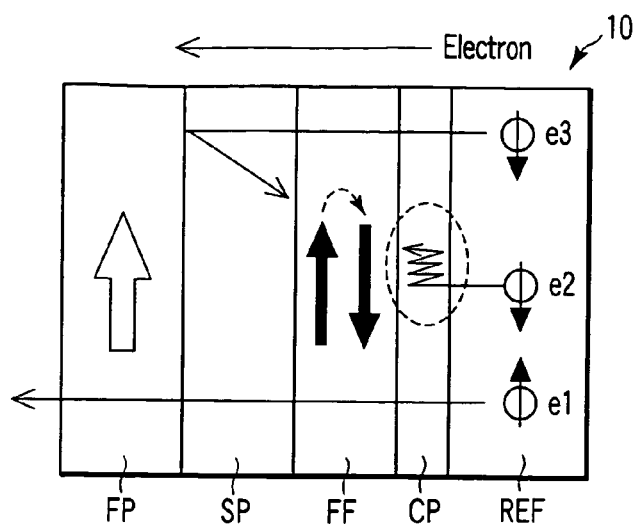

First, to reverse the magnetization of the recording layer FF from the parallel magnetization arrangement to the anti-parallel magnetization arrangement, as shown in FIG. 12A, electrons are supplied from the recording layer FF to the fixed layer FP. In other words, a current is supplied from the fixed layer FP to the recording layer FF.

Figure 12B:
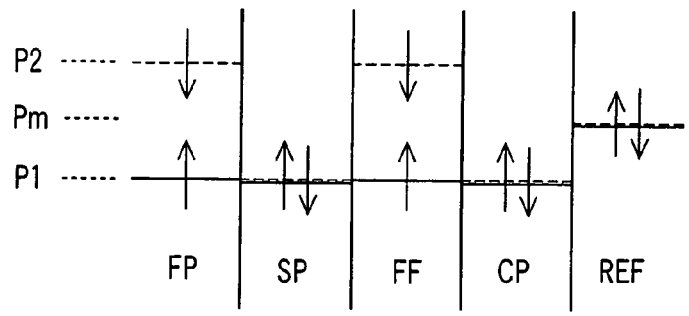

In this case, the upward spin-polarized electrons e1 have almost the same potential as that of the upward spin-polarized electrons in the recording layer FF and fixed layer FP (FIG. 12B). For this reason, the upward spin-polarized electrons e1 readily pass through the recording layer FF and fixed layer FP. In this embodiment, however, the cap layer CP which satisfies predetermined conditions is formed in contact with the recording layer FF. For this reason, the downward spin-polarized electrons e2 are reflected by the surface of the recording layer FF. The reflected downward spin-polarized electrons e2 are further reflected by the surface of the reflecting layer REF. Accordingly, the downward spin-polarized electrons e2 are confined and accumulated in the cap layer CP. The downward spin-polarized electrons e2 accumulated by the confinement effect act on the magnetization of the recording layer FF so that the magnetization of the recording layer FF is reversed from upward to downward. Downward spin-polarized electrons e3 which have passed through the recording layer FF are reflected by the surface of the fixed layer FP and return to the recording layer FF. The downward spin-polarized electrons e3 which have returned also act on the magnetization of the recording layer FF. The magnetization of the recording layer FF is reversed from upward to downward in this way so that the write from the parallel magnetization arrangement to the anti-parallel magnetization arrangement is done.

Figure 13A:
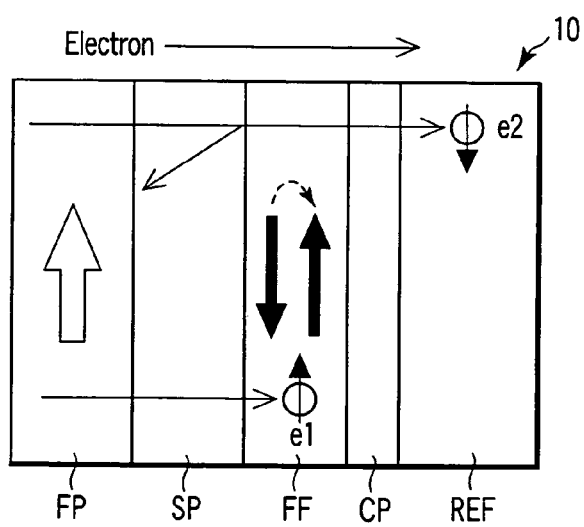
Figure 13B:
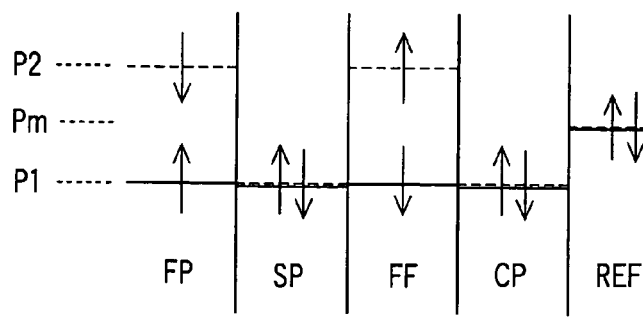

On the other hand, to reverse the magnetization of the recording layer FF from the anti-parallel magnetization arrangement to the parallel magnetization arrangement, as shown in FIG. 13A, electrons are supplied from the fixed layer FP to the recording layer FF. In other words, a current is supplied from the recording layer FF to the fixed layer FP.

In this case, the fixed layer FP whose magnetization is fixed upward mainly generates a number of upward spin-polarized electrons e1. As a result, the upward spin-polarized electrons e1 act on the magnetization of the recording layer FF so that the magnetization of the recording layer FF is reversed to upward. Downward spin-polarized electrons e2 also enter the recording layer FF. However, since the number of upward spin-polarized electrons e1 which enter the recording layer FF is larger than that of the downward spin-polarized electrons e2, the contribution of the downward spin-polarized electrons e2 to the magnetization reversal is small. When the magnetization of the recording layer FF changes upward, the downward spin-polarized electrons e2 are reflected by the surface of the recording layer FF. The magnetization of the recording layer FF is reversed from downward to upward in this way so that the write from the anti-parallel magnetization arrangement to the parallel magnetization arrangement is done.

When "1" or "0" is assigned to the parallel magnetization arrangement state or anti-parallel magnetization arrangement state, binary information can be written.

(c-2) Read Operation

Information written in the magnetic recording element 10 can be read out by using the magnetoresistive effect. More specifically, a sense current equal to or smaller than the reversal current is supplied between the fixed layer FP and the recording layer FF. In the parallel magnetization arrangement, the magnetic resistance has a relatively small value. On the other hand, in the anti-parallel magnetization arrangement, the magnetic resistance has a relatively large value.

When the difference in resistance value is read, data can be read out.

(d) EXAMPLES

The first embodiment of the present invention will be described below in more detail with reference to examples.

(d-1) First Example

In the first example, the reversal current density characteristic caused by current injection is compared between a magnetic recording element 10 having a thin cap layer according to this embodiment and a magnetic recording element having a thick cap layer as a comparative example.

Figure 14:
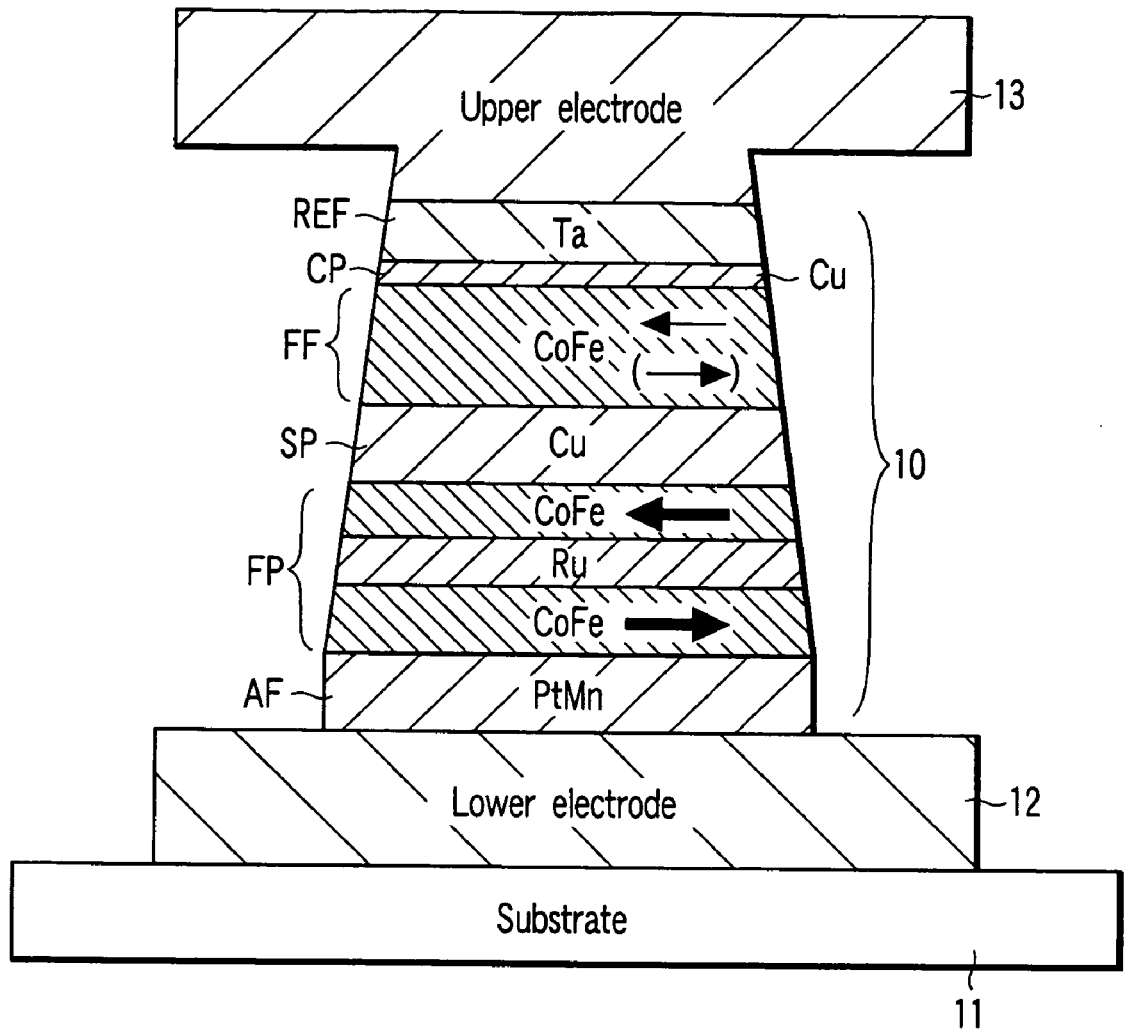
FIG. 14 is a sectional view showing the sectional structure of a magnetic recording element according to the first example of the first embodiment of the present invention.

FIG. 14 is a sectional view showing the sectional structure of a magnetic recording element manufactured by the present inventor. The structures of the manufactured magnetic recording elements 10 are as follows.

(Sample 1)

[PtMn (15 nm)/CoFe (4 nm)/Ru (1 nm)/CoFe (4 nm)]/Cu (6 nm)/CoFe (2.5 nm)/Cu (2 nm)/Ta (10 nm)

(Sample 2)

[PtMn (15 nm)/CoFe (4 nm)/Ru (1 nm)/CoFe (4 nm)]/Cu (6 nm)/CoFe (2.5 nm)/Cu (20 nm)/Ta (10 nm)

Sample 1 is a magnetic recording element 10 having a thin cap layer CP according to this embodiment. Sample 2 is a magnetic recording element 10 having a thick cap layer CP as a comparative example. The magnetic recording elements 10 of Samples 1 and 2 correspond to the structure shown in FIG. 6B in which a fixed layer FP has anti-ferromagnetic coupling.

In both samples, the magnetization of the fixed layer FP is fixed by an anti-ferromagnetic layer AF made of platinum-manganese (PtMn). The fixed layer FP has a CoFe/Ru/CoFe structure with anti-ferromagnetic coupling. A spacer layer SP is made of copper (Cu) having a thickness of 6 nm. A recording layer FF is made of CoFe. The cap layer CP is made of Cu. A reflecting layer REF is made of tantalum (Ta). The thickness of the cap layer CP of Sample 1 is 2 nm. The cap layer CP of Sample 2 is however as thick as 20 nm.

Samples 1 and 2 are manufactured in the following way.

A lower electrode 12 is formed on a wafer. The wafer is loaded in an ultra-high-vacuum sputtering apparatus. After the layered film of the magnetic recording element 10 of each of Samples 1 and 2 is deposited on the lower electrode 12, the wafer is unloaded from the sputtering apparatus. The wafer is subjected to magnetic annealing at 270° C. for 10 hrs in a magnetic vacuum furnace. Accordingly, unidirectional anisotropy is added to the layered film. An EB (Electron Beam) resist is applied to the layered film. EB exposure is executed. Then, a mask having a predetermined shape (a mask having a size of 70 nm×100 nm and long sides parallel to the unidirectional anisotropic axis) is formed. A region which is not covered with the mask is etched to the anti-ferromagnetic layer AF made of PtMn by an ion milling apparatus, thereby forming the magnetic recording element 10. The etching amount can accurately be grasped by introducing sputtered particles to a quadrupole spectrometer by differential pumping and executing mass spectrometric analysis. After etching, the mask is removed. An $SiO_2$ film is formed. The surface of the $SiO_2$ film is smoothened by ion milling so that the upper surface of the reflecting layer REF made of Ta is exposed. An upper electrode 13 is formed on the reflecting layer REF, thus completing Samples 1 and 2 having the structure shown in FIG. 14.

In Samples 1 and 2 manufactured in the above-described way, a current was supplied vertically to the films of the magnetic recording element 10 to execute magnetization reversal by current direct driving, and the magnetoresistive effect was measured, thereby monitoring the magnetization state.

Figure 15A:
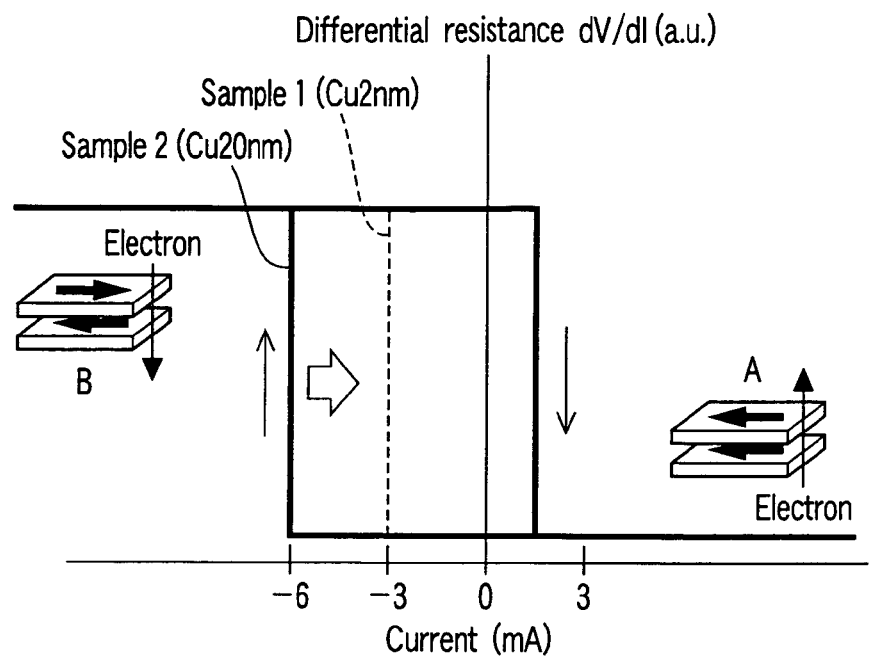

FIG. 15A is a graph (hysteresis curve) showing the current write characteristics of Sample 1 as the first embodiment of the present invention and Sample 2 as a comparative example. FIG. 15A shows the write characteristics when the external field is zero, and the current polarity is defined as a plus when electrons flow from the fixed layer to the recording layer. Referring to FIG. 15A, a background increase according to a current increase is removed.

As shown in FIG. 15A, the magnetic recording element 10 takes a low-resistance state A and high-resistance state B. As is apparent from FIG. 15A, the low-resistance state A is set when the magnetization of the recording layer FF is parallel to the fixed layer FP, and the high-resistance state B is set when the magnetization is anti-parallel. More specifically, when electrons flow from the fixed layer FP to the recording layer FF, the resistance becomes low, and the magnetization of the recording layer FF is parallel to the fixed layer FP. Conversely, when electrons flow from the recording layer FF to the fixed layer FP, the resistance becomes high, and the magnetization of the recording layer FF is anti-parallel to the fixed layer FP. The current necessary for magnetization reversal is defined as a critical current Ic. When a current equal to or larger than the critical current Ic is supplied, information can be recorded in the magnetic recording element 10.

Figure 15B:
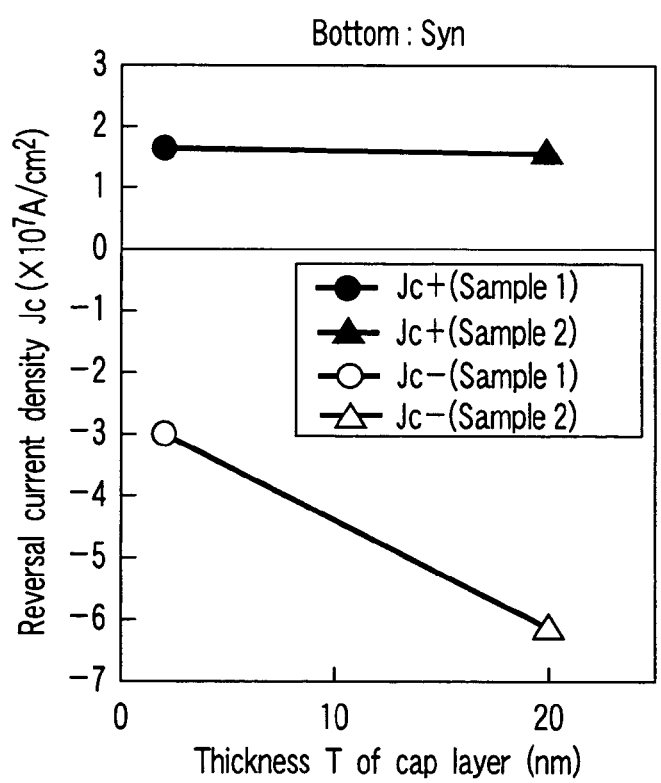

FIG. 15B is a graph showing the difference in reversal current generated by the difference in thickness of the cap layer CP between Sample 1 and Sample 2.

As is apparent from FIG. 15B, when the thickness of the cap layer CP sandwiched between the recording layer FF and the reflecting layer REF decreases from 20 nm to 2 nm, the reversal current density Jc− in parallel→anti-parallel can be reduced while maintaining the reversal current density Jc+ in anti-parallel→parallel, and the asymmetry of the reversal current densities Jc+ and Jc− can be solved. The dependence on the thickness of the cap layer CP was examined in more detail. When the thickness of the cap layer CP exceeds 3 nm, the effect of solving the asymmetry tends to be weak (FIG. 5A).

As described above, when the thickness of the cap layer CP is 3 nm or less, as in Sample 1 of this embodiment, the reversal current density and, more particularly, the reversal current density Jc− in parallel→anti-parallel can be reduced, and the asymmetry of the reversal current densities Jc− and Jc+ can be solved.

(d-2) Second Example

In the second example, the current characteristic is compared between a magnetic recording element according to this embodiment and a magnetic recording element as a comparative example by changing the material of a cap layer CP.

Figure 16:
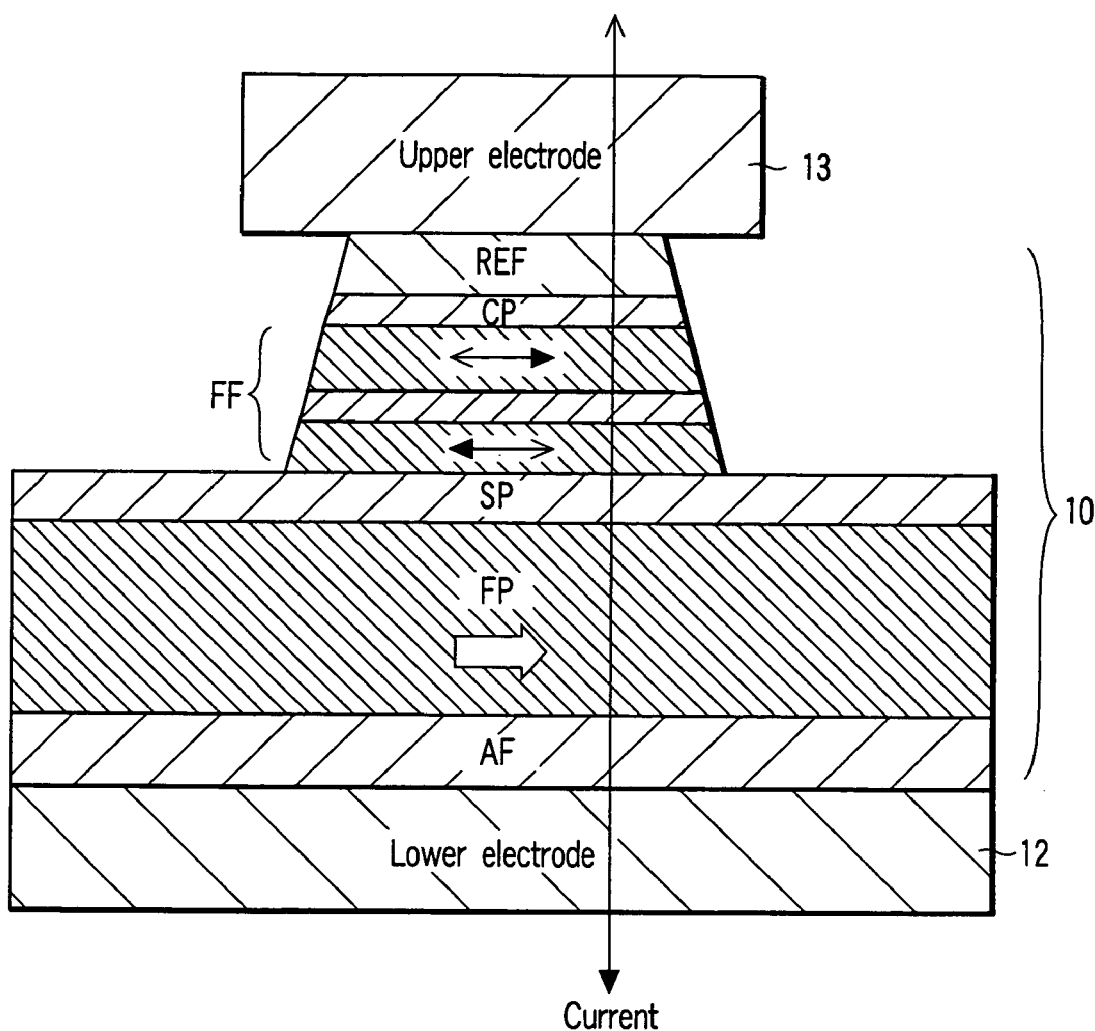
FIG. 16 is a sectional view showing the sectional structure of a magnetic recording element according to the second example of the first embodiment of the present invention.

FIG. 16 is a sectional view showing the sectional structure of a magnetic recording element manufactured by the present inventor. The structures of the manufactured magnetic recording elements are as follows.

(Sample 3)

[PtMn (15 nm)/Co (20 nm)]/$Al_2O_{3-X}$ (0.8 nm)/CoFe (1.2 nm)/Ru (1 nm)/CoFe (1.2 nm)]/Cu (1.4 nm)/Ta (10 nm)

(Sample 4)

[PtMn (15 nm)/Co (20 nm)]/$Al_2O_{3-X}$ (0.8 nm)/CoFe (1.2 nm)/Ru (1 nm)/CoFe (1.2 nm)]/Cr (1.4 nm)/Ta (10 nm)

Sample 3 is a magnetic recording element 10 according to this embodiment. Sample 4 is a magnetic recording element 10 having a Cr cap layer CP as a comparative example. The magnetic recording elements 10 of Samples 3 and 4 correspond to the structure shown in FIG. 6A in which a recording layer FF has anti-ferromagnetic coupling.

In both samples, the magnetization of a fixed layer FP made of Co is fixed by an anti-ferromagnetic layer AF made of PtMn. A spacer layer SP is made of alumina. The recording layer FF is made of CoFe/Ru/CoFe with anti-ferromagnetic coupling. A reflecting layer REF is made of Ta.

As for the atomic potential of Co of the recording layer FF, the atomic potential of the majority-spin band electrons and that of the minority-spin band electrons are −3.1 eV and −1.2 eV, respectively (Fermi energy is set to zero). The atomic potential of Cu (Sample 3) of the cap layer CP is −3.2 eV. The atomic potential of Cr (Sample 4) of the cap layer CP is —0.6 eV.

In Sample 3 which uses Cu as the cap layer material, the atomic potential is less than the intermediate value between the atomic potential of the majority-spin band electrons (−3.1 eV) and that of the minority-spin band electrons (−1.2 eV) of the Co recording layer FF. Hence, Sample 3 satisfies the condition of this embodiment.

In Sample 4 which uses Cr as the cap layer material, the atomic potential is more than the intermediate value between the atomic potential of the majority-spin band electrons (−3.1 eV) and that of the minority-spin band electrons (−1.2 eV) of the Co recording layer FF. Hence, Sample 4 does not satisfy the condition of this embodiment.

Samples 3 and 4 are manufactured in the following way.

A lower electrode 12 is formed on a wafer. The wafer is loaded in an ultra-high-vacuum sputtering apparatus. A multilayered film including PtMn (20 nm)/Co (20 nm)/Al is deposited on the lower electrode 12. Oxygen is introduced into the sputtering apparatus to oxidize Al, thereby forming $Al_2O_{3-X}$. A multilayered film including Cu (6 nm)/CoFe (1.2 nm)/Ru (1 nm)/CoFe (1.2 nm) is deposited on $Al_2O_{3-X}$. Then, the wafer is unloaded from the sputtering apparatus. A resist is applied to the multilayered film, and EB exposure is executed by an EB lithography apparatus. After that, an elliptical mask having a size of 80 nm×130 nm is formed. A region which is not covered with the mask is etched to the upper portion of $Al_2O_{3-X}$ by an ion milling apparatus, thereby forming the magnetic recording element 10. The shape of the magnetic recording element 10 is set such that the longitudinal direction of the magnetic recording element 10 is set along the exchange bias direction. After etching, the mask is removed. An $SiO_2$ film is buried around the magnetic recording element 10. An upper electrode 13 is formed, thus completing Samples 3 and 4 having the structure shown in FIG. 16.

The current characteristics of Samples 3 and 4 manufactured in the above-described way were evaluated. In Sample 3, the reversal current is 2.4 mA in anti-parallel→parallel and −2.5 mA in parallel→anti-parallel. That is, the asymmetry of the reversal currents is solved. To the contrary, in Sample 4, the reversal current is 2.5 mA in anti-parallel→parallel and −5.7 mA in parallel→anti-parallel. That is, the asymmetry of the reversal currents is not solved. The reversal current is still large in parallel→anti-parallel.

As described above, it was confirmed that when the cap layer CP is made of a material having an atomic potential less than the intermediate value between the atomic potential of the majority-spin band electrons and that of the minority-spin band electrons of the recording layer FF, as in Sample 3 of this embodiment, the reversal current Jc− in parallel→anti-parallel can be reduced, and the asymmetry of the reversal current densities Jc− and Jc+ can be solved.

The same tendency as described above can be observed even when MgO, $SiO_2$, Si—O—N, or $SiO_2$ or $Al_2O_3$ in which holes are formed, and a magnetic or conductive metal (Cu, Ag, or Au) is buried in the holes is used in place of $Al_2O_{3-X}$ of Sample 3.

(d-3) Third Example

In the third example, magnetic recording elements 10 having various kinds of layered structures were manufactured, and the average reversal current and the external field dependence of the reversal current were obtained.

Tables 1-1 to 1-3 show reversal currents Jc− and Jc+ in various kinds of layered structures of magnetic recording elements of the third example. The value of Jc− shows by the absolute value.

The layered structures of the magnetic recording elements 10 of numbers 1 to 20 indicate the materials and thicknesses of films (anti-ferromagnetic layer AF/fixed layer FP/spacer layer SP/recording layer FF/cap layer CP/reflecting layer REF) formed from the lower side to the upper side between the lower electrode and the upper electrode. The layered structures were formed by EB lithography and ion milling or EB lithography and RIE (Reactive Ion Etching).

The cap layers CP of the magnetic recording elements 10 of numbers 1 to 20 are made of Cu having a thickness T of 0.8 to 2 nm. That is, the thickness of the cap layer CP is set to 3 nm or less. The material of the cap layer CP has an atomic potential less than the intermediate value between the atomic potential of the majority-spin band electrons and that of the minority-spin band electrons of the recording layer FF.

TABLE 1-1

| Number | Layered structure | Element size | Milling position | Jc+ (mA) | Jc− (mA) |
|---|---|---|---|---|---|
| 1 | PtMn(20 nm)/$Co_9Fe_1$(20 nm)/$Al_2O_{3-X}$(0.7 nm)/[$Co_9Fe_1$(1.5 nm)/Ru(0.2 nm)/$Co_9Fe_1$(1.5 nm)]/Cu(1 nm)/Ta(10 nm) | 80 nm × 140 nm | Up to upper surface of spacer layer | 2.0 | 2.1 |
| 2 | PtMn(20 nm)/$Co_9Fe_1$(20 nm)/$Al_2O_{3-X}$(0.7 nm)/[$Co_9Fe_1$(1 nm)/Ni—Fe(1 nm)/$Co_9Fe_1$(1 nm)]/Cu(0.8 nm)/Ta(10 nm) | 60 nm × 120 nm | Up to upper surface of spacer layer | 1.2 | 0.9 |
| 3 | PtMn(20 nm)/$Co_9Fe_1$(20 nm)/Cu(6 nm)/$Co_9Fe_1$(2.5 nm)/Cu(0.8 nm)/Pt(5 nm) | 60 nm × 110 nm | Up to upper surface of fixed layer | 1.9 | 2.0 |
| 4 | PtIrMn(17 nm)/$Co_9Fe_1$(10 nm)/$Al_2O_{3-X}$(0.7 nm)/[$Co_9Fe_1$(1.2 nm)/Ru(0.9 nm)/$Co_9Fe_1$(1.3 nm)]/Cu(1 nm)/Pt(10 nm) | 120 nm × 200 nm | Up to lower surface of anti-ferromagnetic layer | 1.8 | 1.8 |
| 5 | PtMn(20 nm)/$Co_9Fe_1$(20 nm)/Cu(6 nm)/[$Co_9Fe_1$(1.5 nm)/Ru(0.9 nm)/$Co_9Fe_1$(1.7 nm)]/Cu(2 nm)/Ta(5 nm) | 60 nm × 110 nm | Up to lower surface of anti-ferromagnetic layer | 2.1 | 2.4 |
| 6 | PtMn(15 nm)/[$Co_9Fe_1$(4 nm)/Cu(0.2 nm)/$Co_9Fe_1$(10 nm)]/MgO(1 nm)/[$Co_9Fe_1$(0.6 nm)/NiFe(0.6 nm)/Ru(0.9 nm)/NiFe(0.7 nm)/$Co_9Fe_1$(0.7 nm)]/Cu(1 nm)/W(10 nm) | 60 nm × 110 nm | Up to lower surface of anti-ferromagnetic layer | 1.5 | 1.7 |
| 7 | PtMn(15 nm)/[$Co_9Fe_1$(4 nm)/Ru(1 nm)/$Co_9Fe_1$(4.5 nm)]/Cu(4 nm)/[$Co_9Fe_1$(0.6 nm)/NiFe(0.6 nm)/Ru(0.9 nm)/NiFe(0.7 nm)/$Co_9Fe_1$(0.7 nm)]/Cu(1.4 nm)/Ta(10 nm) | 60 nm × 110 nm | Up to lower surface of anti-ferromagnetic layer | 1.6 | 1.8 |

TABLE 1-2

| Number | Layered structure | Element size | Milling position | Jc+ (mA) | Jc− (mA) |
|---|---|---|---|---|---|
| 8 | PtMn(12 nm)/[$Co_9Fe_1$(1.4 nm)/Ru(0.9 nm)/$Co_9Fe_1$(1.6 nm)]/$Al_2O_{3-X}$(0.8 nm)/$Co_5Fe_5$(3 nm)]/Cu(1.6 nm)/Ta(10 nm) | 70 nm × 100 nm | Up to lower surface of recording layer | 2.8 | 3.0 |
| 9 | PtMn(12 nm)/[$Co_9Fe_1$(1.4 nm)/Ru(0.9 nm)/$Co_9Fe_1$(1.6 nm)]/Cu(6 nm)/$Co_9Fe_1$(3 nm)/Cu(1 nm)/W(10 nm) | 70 nm × 100 nm | Up to lower surface of recording layer | 2.4 | 2.3 |
| 10 | PtMn(20 nm)/$Co_9Fe_1$(20 nm)/Si—O—N(1 nm)/[$Co_9Fe_1$(0.6 nm)/NiFe(0.6 nm)/Ru(1 nm)/NiFe(0.7 nm)/$Co_9Fe_1$(0.7 nm)]/Cu(1 nm)/Ta(10 nm) | 70 nm × 100 nm | Up to upper surface of fixed layer | 0.92 | 1.0 |
| 11 | PtMn(15 nm)/$Co_9Fe_1$(20 nm)/$SiO_2$ with holes (5 nm)/$Co_5Fe_5$(2.5 nm)/Cu(1 nm)/Ta(10 nm) | 60 nm × 150 nm | Up to upper surface of anti-ferromagnetic layer | 1.3 | 1.5 |
| 12 | IrMn(19 nm)/[$Co_8Fe_2$(4 nm)/Ru(1 nm)/$Co_8Fe_2$(5 nm)]/$Al_2O_{3-X}$(1 nm)/[NiFeCo(1.2 nm)/Ru(1 nm)/NiFeCo(1.3 nm)/Cu(6 nm)/$Co_8Fe_2$(4 nm)/Ru(1 nm)/$Co_8Fe_2$(5 nm)/IrMn(19 m)]Cu(1 nm)/W(10 nm) | 60 nm × 120 nm | Up to upper surface of spacer layer | 1.5 | 1.7 |

TABLE 1-2-continued

| Number | Layered structure | Element size | Milling position | Jc+ (mA) | Jc− (mA) |
|---|---|---|---|---|---|
| 13 | PtMn(20 nm)/[Co$_8$Fe$_2$(4 nm)/Ru(1 nm)/ Co$_8$Fe$_2$(5 nm)]/Al$_2$O$_3$ with holes stacked with Cu(3 nm)/ [Co$_9$Fe$_1$(1.2 nm)/Ru(1 nm)/ Co$_9$Fe$_1$(1.3 nm)]/Cu(1 nm)/Pt(10 nm) | 60 nm × 120 nm | Up to lower surface of anti-ferromagnetic layer | 1.2 | 1.4 |
| 14 | PtMn(20 nm)/(Co$_8$Fe$_2$(4 nm)/Ru(1 nm)/ Co$_8$Fe$_2$(5 nm)]/Al$_2$O$_{3-X}$(0.6 nm)/[Co$_9$Fe$_1$(1.2 nm)/ Ru(1 nm)/Co$_9$Fe$_1$(1.3 nm)]/Cu(1 nm)/Al(10 nm) | 60 nm × 120 nm | Up to lower surface of anti-ferromagnetic layer | 0.83 | 0.91 |

TABLE 1-3

| Number | Layered structure | Element size | Milling position | Jc+ (mA) | Jc− (mA) |
|---|---|---|---|---|---|
| 15 | PtMn(15 nm)/[Co$_9$Fe$_1$(4 nm)/Ru(0.9 nm)/ Co$_9$Fe$_1$(4 nm)]/Al—Zr—O(0.8 nm)/Co$_9$Fe(4 nm)/ Cu(1 nm)/Ta—O(7 nm) | 50 nm × 100 nm | Up to lower surface of anti-ferromagnetic layer | 0.65 | 0.68 |
| 16 | NiO/Fe$_3$O$_4$(40 nm)/MgO(0.6 nm)/Co$_8$Fe$_2$(1 nm)/ CoFeNi(2 nm)/Au(2 nm)/Ta—O(5 nm) | 60 nm × 130 nm | Up to upper surface of fixed layer | 0.42 | 0.45 |
| 17 | PtMn(12 nm)/[Co$_9$Fe$_1$(4 nm)/Ru(0.9 nm)/ Co$_9$Fe$_1$(4 nm)]/Al—O(0.6 nm)/ [Co$_9$Fe$_1$(1.5 nm)/Ru(0.9 nm)/ Co$_9$Fe$_1$(1.5 nm)]/Cu(1 nm)/Cu—O(2 nm) | 60 nm × 120 nm | Up to lower surface of anti-ferromagnetic layer | 0.86 | 0.90 |
| 18 | PtMn(12 nm)/[Co$_9$Fe$_1$(4 nm)/Ru(0.9 nm)/ Co$_9$Fe$_1$(4 nm)]/Al—O(0.6 nm)/ [Co$_9$Fe$_1$(1.5 nm)/Cu(1.0 nm)Co$_9$Fe$_1$(1.5 nm)]/ Cu(1 nm)/Ta—O(2 nm) | 60 nm × 120 nm | Up to lower surface of anti-ferromagnetic layer | 0.91 | 0.98 |
| 19 | IrMN(15 nm)/Fe(40 nm)/Mgo(0.8 nm)/ CoFeNi(2.5 nm)/[Co$_9$Fe$_1$(1.5 nm)/Ru(1.0 nm)/ Co$_9$Fe$_1$(1.5 nm)]/Cu(1 nm)/Ta—O(2 nm) | 70 nm × 120 nm | Up to upper surface of fixed layer | 1.8 | 2.0 |
| 20 | PtIrMn(10 nm)/[Co$_9$Fe$_1$(4 nm)/Ru(0.9 nm)/ Co$_9$Fe$_1$(5 nm)]/Al—O(0.7 nm)/ [Co$_9$Fe$_1$(1.5 nm)/Ru(1.0 nm)/ Co$_9$Fe$_1$(1.5 nm)]/Cu(1 nm)/Ta—O(2 nm) | 40 nm × 80 nm | Up to lower surface of anti-ferromagnetic layer | 0.78 | 0.81 |

As is apparent from the results shown in Tables 1-1 to 1-3, when the thickness of the cap layer CP is set to 3 nm or less, and the cap layer CP is made of a material having an atomic potential less than the intermediate value between the atomic potential of the majority-spin band electrons and that of the minority-spin band electrons of the recording layer FF, as in the magnetic recording elements 10 of numbers 1 to 20, the reversal current Jc− in parallel anti-parallel can be reduced, and the asymmetry of the reversal current densities Jc− and Jc+ can be solved.

(d-4) Fourth Example

In the fourth example, the reversal current density characteristic by current injection is compared between a magnetic recording element 10 having a thin reflecting layer according to this embodiment and a magnetic recording element having a thick reflecting layer as a comparative example. The structures of the manufactured magnetic recording elements 10 are as follows.

(Sample A1)

[PtMn (15 nm)/CoFe (4 nm)/Ru (0.8 nm)/CoFeB (5 nm)]/MgO (0.8 nm)/CoFeB (3 nm)/Cu (1.0 nm)/MgO (0.4 nm)

(Sample B1)

[PtMn (15 nm)/CoFe (4 nm)/Ru (0.8 nm)/CoFeB (5 nm)]/MgO (0.8 nm)/CoFeB (3 nm)/Cu (1.0 nm)/MgO (1.8 nm)

(Sample A2)

[PtMn (15 nm)/CoFe (4 nm)/Ru (0.8 nm)/CoFeB (5 nm)]/MgO (0.8 nm)/CoFeB (3 nm)/Cu (1.0 nm)/Ta (5 nm)

(Sample B2)

[PtMn (15 nm)/CoFe (4 nm)/Ru (0.8 nm)/CoFeB (5 nm)]/MgO (0.8 nm)/CoFeB (3 nm)/Cu (1.0 nm)/Ta (40 nm)

Samples A1 and A2 are magnetic recording elements 10 each having a thin reflecting layer according to this embodiment. Samples B1 and B2 are magnetic recording elements 10 each having a thick reflecting layer as comparative examples to Samples A1 and A2. In Samples A1 and B1, MgO is used as the reflecting layer. In Samples A2 and B2, Ta is used as the reflecting layer.

In Samples A1 to B2, the magnetization of a fixed layer FP is fixed by an anti-ferromagnetic layer AF made of platinum-manganese. The fixed layer FP has a CoFe/Ru/CoFeB structure with anti-ferromagnetic coupling. A spacer layer SP uses Cu having a thickness of 0.8 nm. The cap layer uses Cu. The reflecting layer uses an MgO film or Ta. The films were formed on the lower electrode in the order from left to right of the structure expression. The samples were manufactured in accordance with the same procedures as in the first example.

In Samples A1 to B2 manufactured, a current was supplied vertically to the films of the magnetic recording element 10 to execute magnetization reversal by current direct driving, and the magnetoresistive effect was measured, thereby monitoring the magnetization state.

Samples A1 to B2 exhibited a magnetoresistive effect of 90% or more so that a large playback output was obtained.

The current characteristics of Samples A1 and B1 are as follows. In Sample A1, the reversal current was 0.6 mA in anti-parallel→parallel and −0.6 mA in parallel→anti-parallel. In Sample B1, the resistance was high because of the thick reflecting layer. Hence, the voltage necessary for supplying the same current became too high, and the sample was broken by the voltage. As is apparent from this result, when the reflecting layer is made of an insulator, the thickness is preferably decreased to 1 nm or less to reduce the resistance.

The reversal currents of Samples A2 and B2 were compared. In Sample A2, the reversal current was 0.9 mA in anti-parallel→parallel and −1.0 mA in parallel→anti-parallel. In Sample B1, the reversal current was 1.2 mA in anti-parallel→parallel and −2.0 mA in parallel→anti-parallel. As is apparent from this result, when the reflecting layer is thin, a large effect is obtained.

A sample (Sample A3) was manufactured by reversing the arrangement of A1. Even in this sample, the same effect as described above was obtained. The effect of the present invention does not depend on the vertical order of layers in the layer structure.

(Sample A3)

Lower electrode/MgO (0.3 nm)/Cu (1 nm)/CoFeB (3 nm)/MgO (0.8 nm)/[CoFeB (5 nm)/Ru (0.8 nm)/CoFeB (4 nm)]/PtMn (15 nm)

Samples A4 to A7 were manufactured by changing the material of the reflecting layer having a thickness of 1 nm or less, and the reversal current was checked. The same effect as described above was obtained. It was confirmed that the structures were useful when a reflecting layer made of an insulator and having a thickness of 1 nm or less was formed together with a cap layer having a thickness of 3 nm or less.

(Sample A4)

[PtMn (15 nm)/CoFe (4 nm)/Ru (0.8 nm)/$Co_{0.5}Fe_{0.5}$ (4 nm)]/MgO (0.8 nm)/$Co_{0.5}Fe_{0.5}$ (2.5 nm)/Cu (1.0 nm)/MgO (0.4 nm)

(Sample A5)

[PtMn (15 nm)/CoFe (4 nm)/Ru (0.8 nm)/CoFe (4 nm)]/Al—O (0.8 nm)/CoFe (3 nm)/Cu (1.5 nm)/Al—O (0.4 nm)

(Sample A6)

[PtMn (15 nm)/CoFe (4 nm)/Ru (0.8 nm)/CoFe (4 nm)]/Al—O (0.8 nm)/CoFe (3 nm)/Cu (1.5 nm)/Fe—O (1 nm)

(Sample A7)

[PtMn (15 nm)/CoFe (4 nm)/Ru (0.8 nm)/$Co_{0.5}Fe_{0.5}$ (4 nm)]/MgO (0.8 nm)/$Co_{0.5}Fe_{0.5}$ (2.5 nm)/Cu (1.0 nm)/Fe—Co—O (1 nm)

(Sample A8)

[PtMn (15 nm)/CoFe (4 nm)/Ru (0.8 nm)/CoFe (4 nm)]/Al—O (0.8 nm)/[(CoFe (1.5 nm)/Ru (0.8 nm)/CoFe (1.5 nm)]/Cu (1.5 nm)/Fe—O (1 nm)

The same effect as described above can be obtained even when the layered structure of the magnetic recording element 10 is turned upside down.

As described above, according to the first embodiment of the present invention, the cap layer CP having a thickness of 3 nm or less is formed adjacent to the recording layer FF. The cap layer CP is made of a material having an atomic potential less than the intermediate value between the atomic potential of the majority-spin band electrons and that of the minority-spin band electrons of the recording layer FF.

Accordingly, in the write by current driving magnetization reversal, the reversal current Jc− in magnetization reversal from parallel to anti-parallel can be reduced. In addition, the asymmetry of the reversal current densities Jc− and Jc+ can be solved. As a result, the load on the circuit side can be decreased, and damage by heat generated by the magnetization reversal current can be reduced so that a highly reliable magnetic recording element can be implemented. This brings about significant industrial advantages because practical use of current direct driving magnetization reversal is promoted, the function and density of a magnetic recording element can be increased, and power consumption can be reduced.

SECOND EMBODIMENT

In the second embodiment, a magnetic recording device (MRAM: Magnetic Random Access Memory) having the magnetic recording element according to the first embodiment and a transistor in each memory cell will be described. The memory cell of this embodiment has a so-called select transistor structure in which a select transistor is arranged in each cell.

Figure 17:
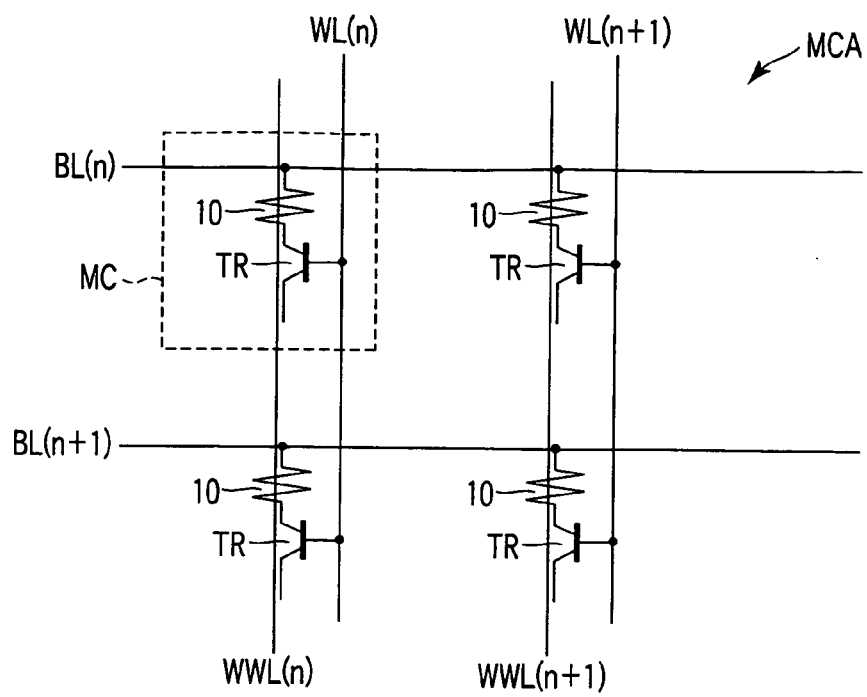
FIG. 17 is a circuit diagram showing the equivalent circuit of the memory cell array of a magnetic recording device according to the second embodiment of the present invention.
Figure 18:
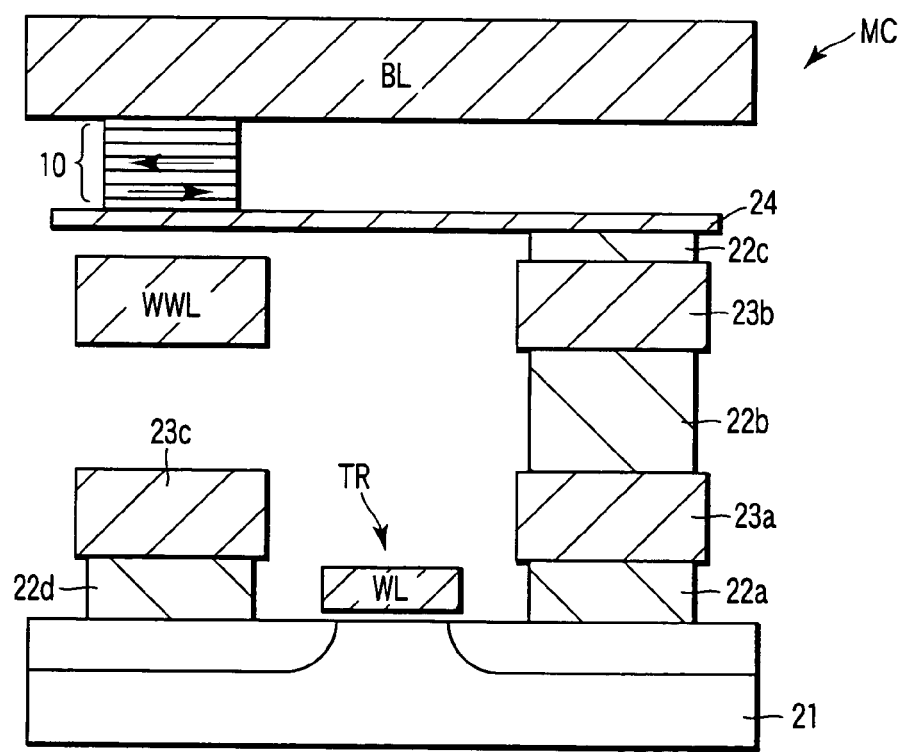
FIG. 18 is a sectional view showing the sectional structure of one memory cell in FIG. 17.

FIG. 17 is a circuit diagram showing the equivalent circuit of the memory cell array of the magnetic recording device according to the second embodiment of the present invention. FIG. 18 is a sectional view showing the sectional structure of one memory cell in FIG. 17.

As shown in FIG. 17, in a memory cell array MCA of the magnetic recording device according to the second embodiment, a plurality of bit lines BLn (n=1, 2, . . . ) and write word lines WWLn are arranged in a matrix. A magnetic recording element 10 is arranged near each of the intersections between the bit lines BLn and the write word lines WWLn. A transistor (e.g., a MOSFET (Metal-Semiconductor-Oxide Field Effect Transistor)) TR is connected to each magnetic recording element 10. The gate electrode of the transistor TR functions as a write/read word line WL. Hence, each memory cell MC includes a bit line BL, write word line WWL, magnetic recording element 10, and transistor TR.

More specifically, as shown in FIG. 18, one terminal of the magnetic recording element 10 is electrically connected to the bit line BL. The other terminal of the magnetic recording element 10 is electrically connected to one end of the current path of the transistor TR through interconnections 23a, 23b, and 24 and contacts 22a, 22b, and 22c. The other end of the current path of the transistor TR is connected to a contact 22d and interconnection 23c. The interconnection 23c may be, e.g., grounded, or a voltage may be supplied to the interconnection 23c. The write word line WWL is arranged under the magnetic recording element 10 and electrically disconnected from the magnetic recording element 10.

FIGS. 19A and 19B are views for explaining the write operation. In the second embodiment, a write by current direct driving (spin injection magnetization reversal) is executed, and at the same time, a current magnetic field write is also executed. This will be described next in detail.

First, the magnetic recording element 10 of an arbitrary cell is selected. The magnetic recording element 10 is selected by selecting the bit line BL connected to it and the gate electrode (word line WL) of the transistor TR connected to it. A write current Iw1 larger than a critical current Ic for magnetization reversal is supplied from the bit line BL to the magnetic recording element 10 or from the magnetic recording element 10 to the bit line BL. Accordingly, information is written in the magnetic recording element 10 by the current direct driving write.

When the write word line WWL located under the magnetic recording element 10 in the arbitrary cell is selected, the current magnetic field write can simultaneously be executed. More specifically, a write current Ir2 is supplied to the write word line WWL upward or downward with respect to the drawing surface to generate a current magnetic field Hw. The synthetic magnetic field of the current magnetic field Hw and a current magnetic field Hb generated by a write current Ir1 further acts on magnetization reversal of the magnetic recording element 10.

In this way, "0"- or "1"-information is written. In this example, a state in which the fixed layer and recording layer have an anti-parallel magnetization arrangement, as shown in FIG. 19A, is defined as a "0" state. A state in which the fixed layer and recording layer have a parallel magnetization arrangement, as shown in FIG. 19B, is defined as a "1" state. The definition of the "0" and "1" states may be reversed.

Figure 20A:
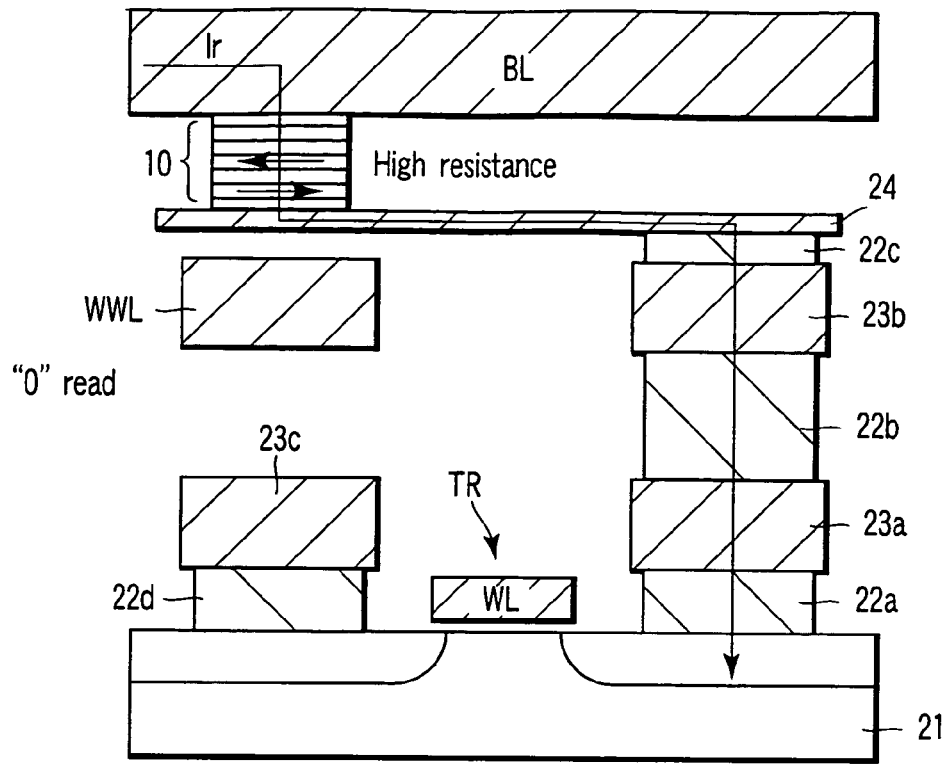
Figure 20B:
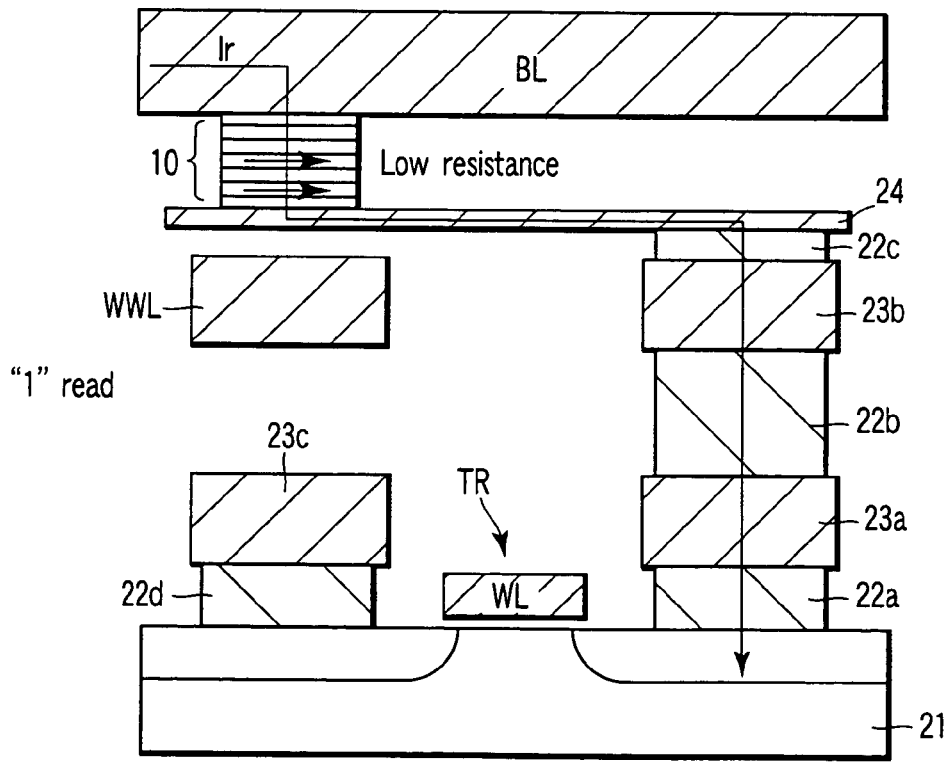

FIGS. 20A and 20B are views for explaining the read operation. In the read, a signal is detected on the basis of the magnitude of the resistance of the magnetic recording element 10. This will be described next in detail.

First, the magnetic recording element 10 is selected by selecting the bit line BL connected to it and the gate electrode (word line WL) of the transistor TR connected to it. A sense current Ir smaller than the critical current Ic for magnetization reversal is supplied to the magnetic recording element 10 to read out information to it. The sense current Ir can be supplied in any direction, i.e., either from the bit line BL to the magnetic recording element 10 or from the magnetic recording element 10 to the bit line BL.

Referring to FIGS. 20A and 20B, when "0" is written, the resistance of the magnetic recording element 10 is high. When "1" is written, the resistance of the magnetic recording element 10 is low. The magnetization state of a recording layer FF is determined by detecting the resistance of the magnetic recording element 10 (directly reading the resistance, reading the voltage, or reading the current), and the signal is played back (read out).

As described above, according to the second embodiment of the present invention, since the magnetic recording element 10 according to the first embodiment is used, in the write by current driving magnetization reversal, a reversal current Jc− in magnetization reversal from parallel to anti-parallel can be reduced. In addition, the asymmetry of the reversal current densities Jc− and Jc+ can be solved.

Furthermore, the memory cell MC according to the second embodiment has the write word line WWL. Hence, the current magnetic field write can also be executed while executing the write by current direct driving. For this reason, the reversal current in the write can further be reduced.

THIRD EMBODIMENT

In the third embodiment, a select transistor memory cell will be described, as in the second embodiment. In the second embodiment, both the current driving magnetization reversal write and the current magnetic field write can be executed. In the third embodiment, however, only the current driving magnetization reversal write is executed.

FIG. 21 is a circuit diagram showing the equivalent circuit of the memory cell array of a magnetic recording device according to the third embodiment of the present invention. FIG. 22 is a sectional view showing the sectional structure of one memory cell in FIG. 21.

As shown in FIGS. 21 and 22, the third embodiment is different from the second embodiment in that only the current driving magnetization reversal write is executed. More specifically, the write word line WWL to execute a magnetic field write in a magnetic recording element 10 is omitted. The magnetic recording element 10 is connected to one end of the current path of a transistor TR through an interconnection 23a and contact 22a. Each memory cell MC includes a bit line BL, magnetic recording element 10, and transistor TR.

FIGS. 23A and 23B are views for explaining the write operation. In the third embodiment, a write by current direct driving is executed. The write is done by supplying a current to the magnetic recording element 10 through the bit line BL. This will be described next in detail.

First, the magnetic recording element 10 of an arbitrary cell is selected. The magnetic recording element 10 is selected by selecting the bit line BL connected to it and the gate electrode (word line WL) of the transistor TR connected to it. A write current Iw larger than a critical current Ic for magnetization reversal is supplied from the bit line BL to the magnetic recording element 10 or from the magnetic recording element 10 to the bit line BL to write a signal in the magnetic recording element 10. The directions of the write current Iw in FIGS. 23A and 23B are reverse to the flows of electrons.

If the magnetic recording element 10 is a normal MR, the magnetization of the ferromagnetic layer of a recording layer FF on the current flow-in side is written such that the magnetization direction becomes the same as that of a fixed layer FP to which the electrons flow first. Hence, the magnetization direction of the recording layer FF changes depending on the polarity of the write current Iw so that "0" can be written as shown in FIG. 23A, and "1" can be written as shown in FIG. 23B. The definition of the "0" and "1" states may be reversed.

Figure 24A:
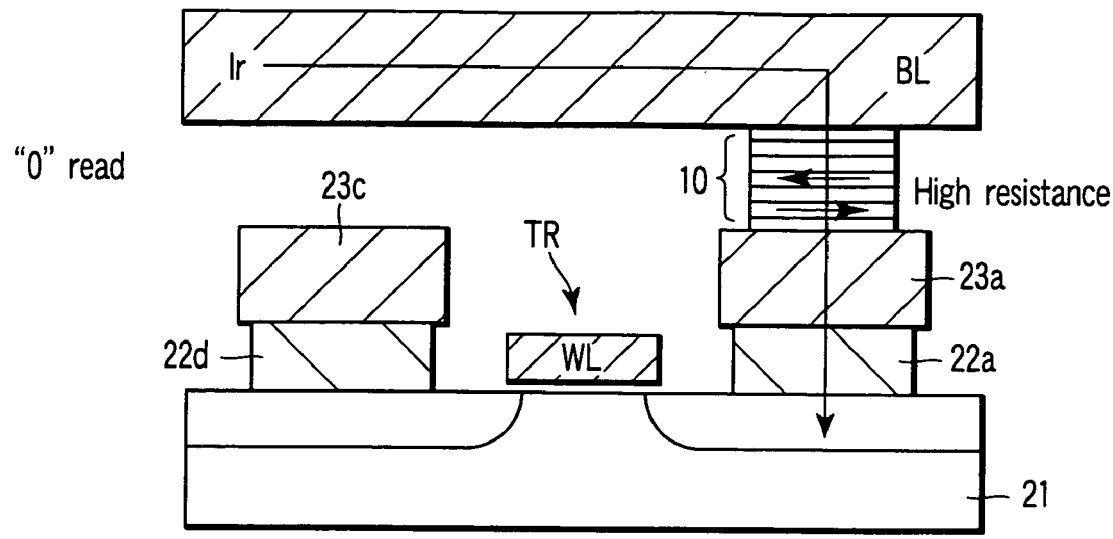
Figure 24B:
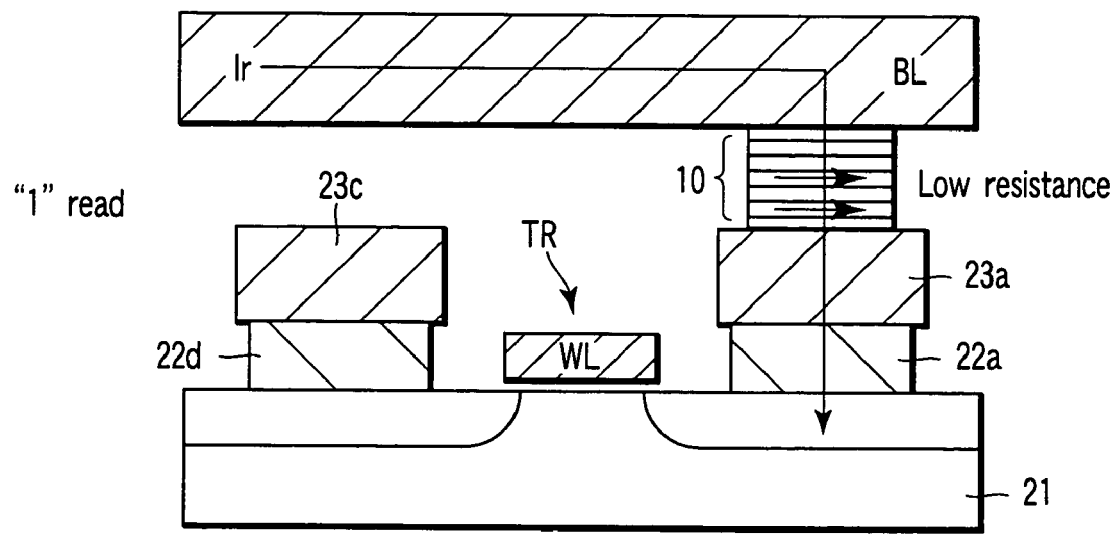

FIGS. 24A and 24B are views for explaining the read operation. In the read, a signal is detected on the basis of the magnitude of the resistance of the magnetic recording element 10. This will be described next in detail.

First, the magnetic recording element 10 is selected by selecting the bit line BL connected to it and the gate electrode (word line WL) of the transistor TR connected to it. A sense current Ir smaller than the critical current Ic for magnetization reversal is supplied to the magnetic recording element 10 to read out a signal to it. The sense current Ir can be supplied in any direction, i.e., either from the bit line BL to the magnetic recording element 10 or from the magnetic recording element 10 to the bit line BL.

Referring to FIGS. 24A and 24B, when "0" is written, the resistance of the magnetic recording element 10 is high. When "1" is written, the resistance of the magnetic recording element 10 is low. The magnetization state of the recording layer FF is determined by detecting the resistance of the magnetic recording element 10 (directly reading the resistance, reading the voltage, or reading the current), and the signal is played back (read out).

When matching to the transistor TR is taken into consideration, a material such as alumina or MgO having a high insulating effect is used as the material of a high-resistance spacer layer SP. When such a high-resistance spacer layer is formed, the magnetoresistive effect through the spacer layer SP can be detected. A CCP-CPP-MR or nanocontact MR prepared by forming holes in an insulating layer and burying Cu or a magnetic material in the holes is also suitable because the resistance can be adjusted.

Referring to FIGS. 24A and 24B, "0" is assigned to the low-resistance state, and "1" is assigned to the high-resistance state. The definition may be reversed, as a matter of course.

As described above, according to the third embodiment of the present invention, since the magnetic recording element 10 according to the first embodiment is used, in the write by current driving magnetization reversal, a reversal current Jc– in magnetization reversal from parallel to anti-parallel can be reduced. In addition, the asymmetry of the reversal current densities Jc– and Jc+ can be solved.

Furthermore, the memory cell MC according to the third embodiment has no write word line WWL of the second embodiment. Hence, the cell area can be reduced.

FOURTH EMBODIMENT

In the fourth embodiment, a read switching element to select a magnetic recording element is arranged, as in the second and third embodiments. A diode is used in place of a transistor.

FIG. 25 is a circuit diagram showing the equivalent circuit of the memory cell array of a magnetic recording device according to the fourth embodiment of the present invention, which uses a diode.

As shown in FIG. 25, in a memory cell array MCA of the magnetic recording device according to the fourth embodiment, a plurality of bit lines BLn and word lines WLn are arranged in a matrix. A magnetic recording element 10 and diode D, which are connected in series, are arranged near each of the intersections between the bit lines BLn and the word lines WLn. Hence, each memory cell MC includes a bit line BL, word line WL, magnetic recording element 10, and diode D.

In the fourth embodiment, the write operation is executed in the following way. First, the bit line BL and word line WL corresponding to an arbitrary magnetic recording element 10 are selected. A write current Iw larger than a critical current Ic for magnetization reversal is supplied from the bit line BL to the magnetic recording element 10 or from the magnetic recording element 10 to the bit line BL to write "0"- or "1"-information in the magnetic recording element 10 by the current direct driving write. At this time, the diode D has a function of shielding current components which flow to cells connected to unselected word lines WL and bit lines BL.

The read operation is executed in the following way. First, the magnetic recording element 10 is selected by selecting the bit line BL and word line WL connected to the magnetic recording element 10. A sense current Ir smaller than the critical current Ic for magnetization reversal is supplied to the magnetic recording element 10 to read out information from it. The sense current Ir can be supplied in any direction, i.e., either from the bit line BL to the magnetic recording element 10 or from the magnetic recording element 10 to the bit line BL. The magnetization state of a recording layer FF is determined by detecting the resistance of the magnetic recording element 10, and the signal is played back (read out).

As described above, according to the fourth embodiment of the present invention, since the magnetic recording element 10 according to the first embodiment is used, in the write by current driving magnetization reversal, a reversal current Jc– in magnetization reversal from parallel to anti-parallel can be reduced. In addition, the asymmetry of the reversal current densities Jc– and Jc+ can be solved.

Furthermore, the memory cell MC according to the fourth embodiment can reduce the area of the switching element, as compared to the second and third embodiments. Hence, the cell area can be reduced.

FIG. 25 schematically shows the general diode D. However, in a normal diode, the current flows only in one direction. To execute the write by current driving magnetization reversal, various changes and modifications are done by, e.g., arranging a plurality of diodes to supply the current in both directions of the magnetic recording element 10.

FIFTH EMBODIMENT

In the fifth embodiment, an example of a so-called cross-point memory cell which has no switching element for a read arranged in each cell, unlike the second to fourth embodiments, will be described.

Figure 27:
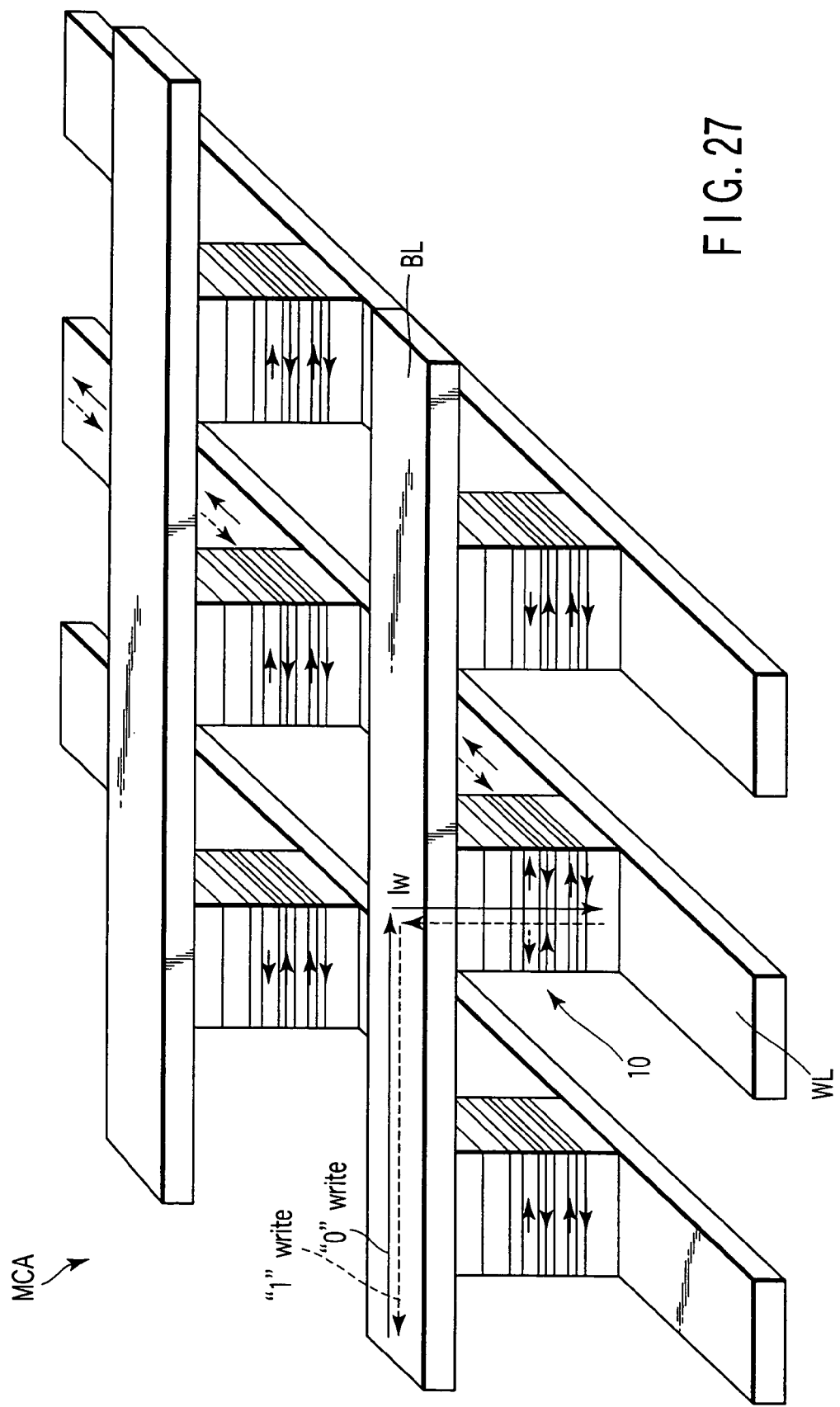
FIG. 27 is a perspective view showing the structure of the memory cell array shown in FIG. 26.

FIG. 26 is a circuit diagram showing the equivalent circuit of the memory cell array of a magnetic recording device according to the fifth embodiment of the present invention. FIG. 27 is a perspective view showing the structure of the memory cell array shown in FIG. 26.

As shown in FIGS. 26 and 27, in a memory cell array MCA of the magnetic recording device according to the fifth embodiment, a plurality of bit lines BLn and word lines WLn are arranged in a matrix. A magnetic recording element 10 is arranged near each of the intersections between the bit lines BLn and the word lines WLn. One terminal of the magnetic recording element 10 is connected to a bit line BL, and the other terminal is connected to a word line WL. Hence, each memory cell MC includes the bit line BL, word line WL, and magnetic recording element 10. The magnetic recording element 10 uses the structure shown in FIG. 7A in which both the recording layer and the fixed layer have anti-ferromagnetic coupling.

In the fifth embodiment, the write operation is executed in the following way. First, the bit line BL and word line WL corresponding to an arbitrary magnetic recording element 10 are selected. A write current Iw larger than a critical current Ic for magnetization reversal is supplied from the bit line BL to the magnetic recording element 10 or from the magnetic recording element 10 to the bit line BL to write "0"- or "1"-information in the magnetic recording element 10.

The read operation is executed in the following way. First, the magnetic recording element 10 is selected by selecting the bit line BL and word line WL connected to the magnetic recording element 10. A sense current Ir smaller than the critical current Ic for magnetization reversal is supplied to the magnetic recording element 10 to read out information from it. The sense current Ir can be supplied in any direction, i.e., either from the bit line BL to the magnetic recording element 10 or from the magnetic recording element 10 to the bit line BL. The magnetization state of a recording layer FF is determined by detecting the resistance of the magnetic recording element 10, and the signal is played back (read out).

As described above, according to the fifth embodiment of the present invention, since the magnetic recording element 10 according to the first embodiment is used, in the write by current driving magnetization reversal, a reversal current Jc– in magnetization reversal from parallel to anti-parallel can be reduced. In addition, the asymmetry of the reversal current densities Jc– and Jc+ can be solved.

Furthermore, the memory cell MC according to the fifth embodiment has no switching element, unlike the second to fourth embodiments. Hence, the cell area can be reduced.

The cross-point magnetic recording device as in this embodiment has a structure which can easily increase the degree of integration.

SIXTH EMBODIMENT

In the sixth embodiment, a probe storage magnetic recording device will be described, in which the magnetic recording element 10 according to the first embodiment is applied to a so-called "patterned medium", and the medium is accessed by a probe.

Figure 28:
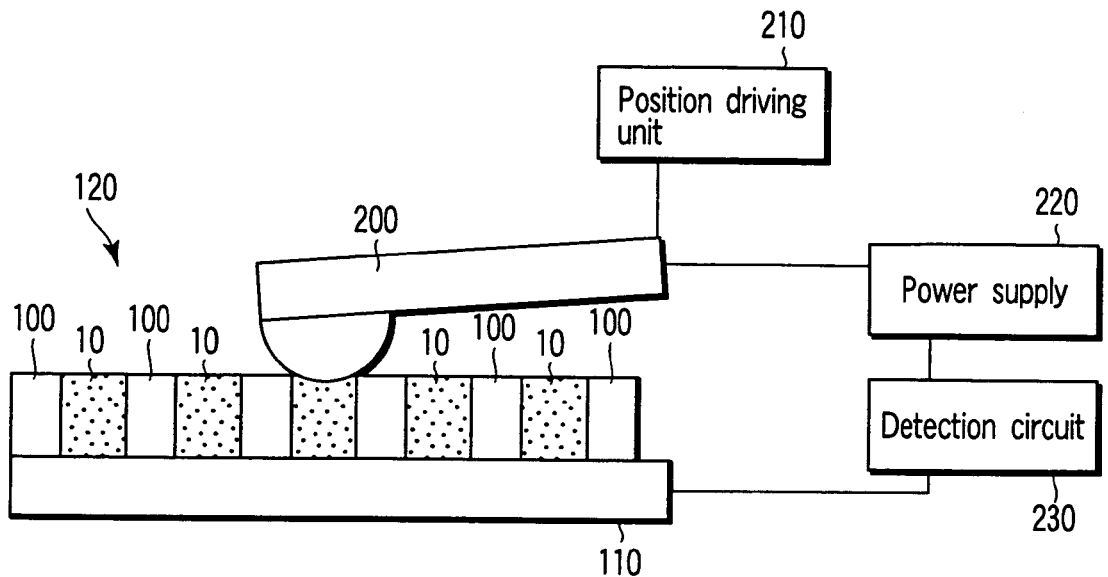
FIG. 28 is a schematic view showing a probe storage magnetic recording device according to the sixth embodiment of the present invention.

FIG. 28 is a schematic view showing a probe storage magnetic recording device according to the sixth embodiment of the present invention. As shown in FIG. 28, in a patterned medium (recording medium) 120, a plurality of magnetic recording elements 10 according to the first embodiment are arrayed in a matrix on a conductive substrate 110 in the plane of a high-resistance insulating material 100. A conductive probe 200 to select an arbitrary magnetic recording element 10 and access it is arranged on the surface of the medium 120. A position driving device 210 to control the relative positional relationship between the probe 200 and the surface of the medium 120 is connected to the probe 200. A power supply 220 to apply a current or voltage from the probe 200 to the magnetic recording element 10 is also connected to the probe 200. A detection circuit 230 to detect the internal magnetization state of the magnetic recording element 10 as a change in electrical resistance is connected to the power supply 220 and substrate 110.

The position driving device 210 shown in FIG. 28 is connected to the probe 200 to change the position of the probe 200. However, the present invention is not limited to this. The position driving device 210 only needs to control the relative position between the medium 120 and the probe 200. Hence, the position driving device 210 may be connected to, e.g., the side of the medium 120 to change the position of the medium 120.

The magnetic recording elements 10 shown in FIG. 28 share only the lower electrode on the conductive substrate 110. However, the present invention is not limited to this. For example, the magnetic recording elements 10 may share a layer such as an anti-ferromagnetic layer AF or fixed layer FP. With this structure, the process can be more simple, and the characteristic can be more uniform.

In the sixth embodiment, the write or read is done by supplying a current between the probe 200 and the substrate 110 through the magnetic recording element 10. The magnetic recording element 10 is selected by changing the relative positional relationship between the probe 200 and the medium 120. The probe 200 only needs to be electrically connected to the magnetic recording element 10. Hence, the probe 200 can be either in contact with the magnetic recording element 10 or in a noncontact state. In the noncontact state, the write or read can be executed by using a tunnel current which flows between the magnetic recording element 10 and the probe 200 or a current by field emission.

The write in the magnetic recording element 10 is done by a current flowing from the probe 200 which has accessed the magnetic recording element 10 to it or a current flowing from the magnetic recording element 10 to the probe 200. Let Is be the magnetization reversal current determined by the size, structure, and composition of the magnetic recording element 10. When a write current Iw larger than the magnetization reversal current Is is supplied to the magnetic recording element 10, the write can be done. The direction of magnetization to be recorded is the same as the magnetization direction of the fixed layer FP through which electrons pass first. Hence, when the electrons flow, i.e., the polarity of the current is reversed, "0" or "1" can appropriately be written.

On the other hand, the read is done by a current flowing from the probe 200 which has accessed the magnetic recording element 10 to it or a current flowing from the magnetic recording element 10 to the probe 200, as in the write. In the read, a playback current Ir smaller than the magnetization reversal current Is is supplied. The recording state of the recording layer FF is determined by detecting the voltage or resistance. Hence, in the magnetic recording device according to this embodiment, the write or read can be executed by supplying a current which satisfies Iw>Ir.

Figure 29:
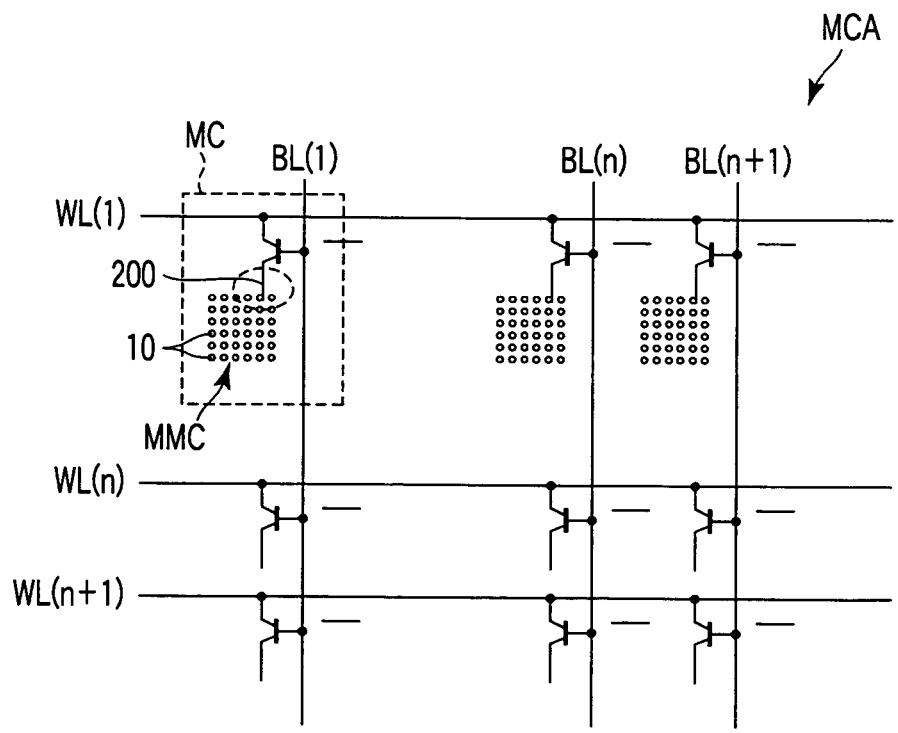
FIG. 29 is a schematic view showing a memory cell array with multiple probes in the probe storage magnetic recording device according to the sixth embodiment of the present invention.

FIG. 29 is a schematic view showing a memory cell array with multiple probes. Referring to FIG. 29, the magnetic recording elements 10 according to the first embodiment are arrayed on a substrate to form 32×32 matrix memory cells MMC. In addition, 32×32 sets of matrix memory cells MMC are arrayed to form a 1-Mbit recording/playback medium. The write or read is done for the recording/playback medium by using 32×32 probes 200. That is, one probe 200 corresponds to one set of matrix memory cells MMC.

More specifically, bit lines BL and word lines WL to select the probe 200 are arranged in a matrix. The probe 200 is arranged near each of the intersections between the bit lines BL and word lines WL. One terminal of the probe 200 is connected to one end of the current path of the select transistor. The other end of the current path of the transistor is connected to the word line WL. The gate of the transistor is connected to the bit line BL. The probe 200 is selected by selecting the bit line BL and word line WL to select the transistor to be turned on.

Probing is the same as described above with reference to FIG. 28. The magnetic recording element 10 in the matrix memory cells MMC corresponding to each probe 200 can be selected by an X—Y driving mechanism arranged in the medium. If the positional relationship relatively changes, the magnetic recording element 10 may be selected by a driving mechanism arranged in the probe 200. Since the probes 200 themselves form multiple probes, the probe 200 may be connected to the so-called word line WL and bit line BL and selected by selecting the word line WL and bit line BL.

The write and read of the magnetic recording element 10 shown in FIG. 29 are the same as in FIG. 28 and are executed by the current injected from the probe 200 which has accessed the magnetic recording element 10. In the write, the current Iw is supplied from the probe 200 to the magnetic recording element 10 or from the magnetic recording element 10 to the probe 200 to record "0"- or "1"-information. In the read, the read current Ir is supplied to the magnetic recording element 10 to measure the of the magnetic recording element 10. High and low resistances are assigned to "0"- and "1"-information.

As described above, according to the sixth embodiment of the present invention, since the magnetic recording element 10 according to the first embodiment is used, in the write by current driving magnetization reversal, a reversal current Jc− in magnetization reversal from parallel to anti-parallel can be reduced. In addition, the asymmetry of the reversal current densities Jc− and Jc+ can be solved.

The embodiments of the present invention have been described above. The present invention is not limited to the embodiments, and various changes and modifications can be made without departing from the spirit and scope of the present invention.

For example, when those skilled in the art appropriately select the detailed dimensions and materials of the elements and the shapes and materials of the electrodes, passivation, and insulating structure in the magnetic recording element 10 from a known range, and the same effect as described above can be obtained, they are also incorporated in the present invention.

Each of the constituent elements such as the anti-ferromagnetic layer AF, ferromagnetic layers (fixed layer FP and recording layer FF), nonmagnetic layers (spacer layer SP, cap layer CP, and reflecting layer REF), and insulating layer in the magnetic recording element 10 may be formed as a single layer or a layered structure including two or more layers.

The layered structure of the magnetic recording element 10 is not limited to the illustrated examples. Even when the layers of the layered structure are formed in a reverse order, the same effect as described above can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic recording element in which information is recorded by supplying to a magnetic material a spin-polarized electron which is spin-polarized, comprising:
    a fixed layer whose magnetization is substantially fixed, which has a first surface and a second surface, and is essentially made of a ferromagnetic material;
    a recording layer whose magnetization is reversed by an action of the spin-polarized electron, which has a third surface and a fourth surface, and is essentially made of a ferromagnetic material having a first atomic potential sensed by the majority-spin band electrons and a second atomic potential sensed by the minority-spin band electrons;
    a spacer layer which is arranged between the fixed layer and the recording layer, is in contact with the second surface and the third surface, and is essentially made of a nonmagnetic material;
    a cap layer which has a fifth surface and a sixth surface, is essentially made of a metal nonmagnetic material having a third atomic potential, sensed by both the majority-spin band electrons and the minority-spin band electrons, that is less than an intermediate value between the first potential and the second potential, and has a thickness of not more than 3 nm, the fifth surface being in direct contact with the fourth surface; and
    a reflecting layer which is in direct contact with the sixth surface, is essentially made of a nonmagnetic material having a fourth atomic potential, sensed by both the majority-spin band electrons and the minority-spin band electrons, that is different from the third potential, and has a thickness of not more than 20 nm, wherein
    the cap layer comprises a member of the group consisting of Cu, Au and Ag; and
    the reflecting layer comprises a member of the group consisting of Ta, Pt, Ru, Al, W, Ta oxides, Al oxides, Si oxides, Si oxynitrides, Si nitrides, Fe oxides, Mg oxides, Al—Zr oxides, Ge oxides, Cu oxides, GaAlAs, Si, Ge and GaAs.

2. The element according to claim 1, wherein the spacer layer is essentially made of one of an insulating material and a semiconductor material.

3. The element according to claim 1, wherein the spacer layer is essentially made of a metal material.

4. The element according to claim 1, wherein
    the recording layer has a layered structure including a first magnetic layer, a second magnetic layer, and a nonmagnetic layer sandwiched between the first magnetic layer and the second magnetic layer, and
    the layered structure is an anti-ferromagnetic coupling structure in which a magnetization direction of the first magnetic layer and a magnetization direction of the second magnetic layer are anti-parallel.

5. The element according to claim 1, wherein
    the recording layer has a layered structure including a first magnetic layer, a second magnetic layer, and a nonmagnetic layer sandwiched between the first magnetic layer and the second magnetic layer, and
    the layered structure is a ferromagnetic coupling structure in which a magnetization direction of the first magnetic layer and a magnetization direction of the second magnetic layer are parallel.

6. The element according to claim 1, wherein
    the fixed layer has a layered structure including a first magnetic layer, a second magnetic layer, and a nonmagnetic layer sandwiched between the first magnetic layer and the second magnetic layer, and
    the layered structure is an anti-ferromagnetic coupling structure in which a magnetization direction of the first magnetic layer and a magnetization direction of the second magnetic layer are anti-parallel.

7. The element according to claim 1, wherein
    the fixed layer has a layered structure including a first magnetic layer, a second magnetic layer, and a nonmagnetic layer sandwiched between the first magnetic layer and the second magnetic layer, and
    the layered structure is a ferromagnetic coupling structure in which a magnetization direction of the first magnetic layer and a magnetization direction of the second magnetic layer are parallel.

8. The element according to claim 1, wherein
    the recording layer has a first layered structure including a first magnetic layer, a second magnetic layer, and a first nonmagnetic layer sandwiched between the first magnetic layer and the second magnetic layer,
    the fixed layer has a second layered structure including a third magnetic layer, a fourth magnetic layer, and a second nonmagnetie layer sandwiched between the third magnetic layer and the fourth magnetic layer,
    the first layered structure is an anti-ferromagnetic coupling structure in which a magnetization direction of the first magnetic layer and a magnetization direction of the second magnetic layer are anti-parallel, and
    the second layered structure is an anti-ferromagnetic coupling structure in which a magnetization direction of the third magnetic layer and a magnetization direction of the fourth magnetic layer are anti-parallel.

9. The element according to claim 1, wherein
    the recording layer has a first layered structure including a first magnetic layer, a second magnetic layer, and a first nonmagnetic layer sandwiched between the first magnetic layer and the second magnetic layer,
    the fixed layer has a second layered structure including a third magnetic layer, a fourth magnetic layer, and a second nonmagnetic layer sandwiched between the third magnetic layer and the fourth magnetic layer, the first layered structure is a ferromagnetic coupling structure in which a magnetization direction of the first magnetic layer and a magnetization direction of the second magnetic layer are parallel, and the second layered structure is a ferromagnetic coupling structure in which a magnetization direction of the third magnetic layer and a magnetization direction of the fourth magnetic layer are parallel.

10. The element according to claim 1, wherein the recording layer has a first layered structure including a first magnetic layer, a second magnetic layer, and a first nonmagnetic layer sandwiched between the first magnetic layer and the second magnetic layer, the fixed layer has a second layered structure including a third magnetic layer, a fourth magnetic layer, and a second nonmagnetic layer sandwiched between the third magnetic layer and the fourth magnetic layer, the first layered structure is an anti-ferromagnetic coupling structure in which a magnetization direction of the first magnetic layer and a magnetization direction of the second magnetic layer are anti-parallel, and the second layered structure is a ferromagnetic coupling structure in which a magnetization direction of the third magnetic layer and a magnetization direction of the fourth magnetic layer are parallel.

11. The element according to claim 1, wherein the recording layer has a first layered structure including a first magnetic layer, a second magnetic layer, and a first nonmagnetic layer sandwiched between the first magnetic layer and the second magnetic layer, the fixed layer has a second layered structure including a third magnetic layer, a fourth magnetic layer, and a second nonmagnetic layer sandwiched between the third magnetic layer and the fourth magnetic layer, the first layered structure is a ferromagnetic coupling structure in which a magnetization direction of the first magnetic layer and a magnetization direction of the second magnetic layer are parallel, and the second layered structure is an anti-ferromagnetic coupling structure in which a magnetization direction of the third magnetic layer and a magnetization direction of the fourth magnetic layer are anti-parallel.

12. The element according to claim 1, wherein at least one of the fixed layer and the recording layer comprises a plurality of magnetic layers.

13. The element according to claim 1, further comprising an anti-ferromagnetic layer which is in contact with the first surface and fixes the magnetization of the fixed layer.

14. The element according to claim 1, wherein the reflecting layer comprises a metal layer.

15. The element according to claim 1, wherein the reflecting layer comprises an insulating layer having a thickness of not more than 1 nm.

16. A magnetic recording device comprising:

a memory cell comprising the magnetic recording element of claim 1.

17. The device according to claim 16, wherein the memory cell further comprises one of a bit line and a word line, which is connected to one terminal of the magnetic recording element, and a switching element which is connected to the other terminal of the magnetic recording element.

18. The device according to claim 17, wherein the memory cell further comprises a write word line which is electrically isolated from the magnetic recording element and supplies a write current to the magnetic recording element in recording information.

19. The device according to claim 16, wherein the memory cell further comprises a bit line which is connected to one terminal of the magnetic recording element, and a word line which is connected to the other terminal of the magnetic recording element.

20. The device according to claim 16, wherein a plurality of magnetic recording elements are arranged in the memory cell, and the device further comprises a probe which selects the magnetic recording element and accesses the magnetic recording element, and a position driving device which controls a relative position between the probe and the magnetic recording element.

* * * * *

UNITED STATES PATENT AND TRADEMARK OFFICE
CERTIFICATE OF CORRECTION

| | | |
|---|---|---|
| PATENT NO. | : 7,381,480 B2 | Page 1 of 1 |
| APPLICATION NO. | : 11/117482 | |
| DATED | : June 3, 2008 | |
| INVENTOR(S) | : Nakamura et al. | |

It is certified that error appears in the above-identified patent and that said Letters Patent is hereby corrected as shown below:

On the title page, Item (54), and Column 1, the title is incorrect. Item (54) and Column 1, lines 1-3, should read:

Item -- (54) MULTIPLE LAYERED MAGNETIC RECORDING ELEMENT AND MULTIPLE LAYERED MAGNETIC RECORDING DEVICE USING THE SAME--

Signed and Sealed this

Fifth Day of August, 2008

JON W. DUDAS
*Director of the United States Patent and Trademark Office*